(12) United States Patent
Melamed et al.

(10) Patent No.: US 8,026,041 B2
(45) Date of Patent: Sep. 27, 2011

(54) IMAGEABLE ELEMENTS USEFUL FOR WATERLESS PRINTING

(75) Inventors: Ophira Melamed, Shoham (IL); Jianbing Huang, Trumbull, CT (US); Efrat Konstantini, Bat-Yam (IL); Eynat Matzner, Ady (IL)

(73) Assignee: Eastman Kodak Company, Rochester, NY (US)

( * ) Notice: Subject to any disclaimer, the term of this patent is extended or adjusted under 35 U.S.C. 154(b) by 636 days.

(21) Appl. No.: 12/060,906

(22) Filed: Apr. 2, 2008

(65) Prior Publication Data

US 2009/0253069 A1 Oct. 8, 2009

(51) Int. Cl.
*G03F 7/00* (2006.01)
*G03F 7/26* (2006.01)

(52) U.S. Cl. .............. 430/272.1; 101/450.1; 430/270.1; 430/302; 430/281.1

(58) Field of Classification Search ............ 430/270.1, 430/302; 101/450.1
See application file for complete search history.

(56) References Cited

U.S. PATENT DOCUMENTS

| | | | |
|---|---|---|---|
| 4,342,820 A | 8/1982 | Kinashi et al. | |
| 4,842,988 A | 6/1989 | Herrmann et al. | |
| 5,339,737 A | 8/1994 | Lewis et al. | |
| 5,353,705 A | 10/1994 | Lewis et al. | |
| 5,464,686 A | 11/1995 | Higashi et al. | |
| 5,919,600 A * | 7/1999 | Huang et al. | 430/272.1 |
| 6,074,797 A | 6/2000 | Suezawa et al. | |
| 6,096,476 A | 8/2000 | Yanagida et al. | |
| 6,194,122 B1 | 2/2001 | Ichikawa et al. | |
| 6,284,433 B1 | 9/2001 | Ichikawa et al. | |
| 6,479,207 B1 * | 11/2002 | Mori | 430/138 |
| 6,613,496 B1 * | 9/2003 | Inno et al. | 430/303 |
| 6,843,176 B2 | 1/2005 | Ray et al. | |
| 6,964,841 B2 | 11/2005 | Iihara et al. | |
| 7,273,689 B2 | 9/2007 | Wieland et al. | |
| 2007/0003875 A1 * | 1/2007 | Vermeersch et al. | 430/302 |

FOREIGN PATENT DOCUMENTS

| | | |
|---|---|---|
| EP | 0 763 424 A2 | 3/1997 |
| EP | 0763424 A2 * | 3/1997 |
| WO | WO 99/11467 A1 | 3/1999 |

\* cited by examiner

*Primary Examiner* — Cynthia Kelly
*Assistant Examiner* — Chanceity Robinson
(74) *Attorney, Agent, or Firm* — J. Lanny Tucker

(57) ABSTRACT

A non-ablative negative-working imageable element has first and second polymeric layers under a crosslinked silicone rubber layer. These elements can be used in a simple method to provide lithographic printing plates useful for waterless printing (no fountain solution). Processing after imaging is relatively simple using either water or an aqueous solution containing very little organic solvent to remove the imaged regions. The crosslinked silicone rubber layer is ink-repelling and only the first layer that is closest to the substrate contains an infrared radiation absorbing compound to provide thermal sensitivity.

21 Claims, No Drawings

IMAGEABLE ELEMENTS USEFUL FOR WATERLESS PRINTING

FIELD OF THE INVENTION

This invention provides a non-ablative imageable element that can be imaged without ablation and developed with water or a simple aqueous solution and then used for "waterless" printing. This invention also provides a method of using such non-ablative imageable elements.

BACKGROUND OF THE INVENTION

In conventional or "wet" lithographic printing, ink receptive regions, known as image areas, are generated on a hydrophilic surface. When the surface is moistened with water and ink is applied, the hydrophilic regions retain the water and repel the ink, and the ink receptive regions accept the ink and repel the water. The ink is transferred to the surface of a material upon which the image is to be reproduced. For example, the ink can be first transferred to an intermediate blanket that in turn is used to transfer the ink to the surface of the material upon which the image is to be reproduced.

Waterless printing plates have been known and used since 1970. These printing plates can be used for printing without the need for dampening water (fountain solution) on-press. Most waterless printing plates involve an ink-repelling layer such as a silicone layer overlying a radiation-sensitive layer and substrate that are more ink-receptive. Some details of waterless printing and its advantages are provided, for example, at www.wateress.org that is a web site for the Waterless Printing Association.

For example, some of the benefits of waterless printing include consistent color in the image (better color fidelity), better color saturation, and lower dot gain (more detail). In addition, because a fountain solution is not used during printing, a greater variety of papers including uncoated papers, can be used in printing. Moreover, faster make-readies can be achieved with waterless printing and small compact printing presses can be used so that printing operations can be carried out in smaller facilities (less investment in equipment and buildings). By avoiding the use of a fountain solution, waterless printing is better for the environment. Printing operators no longer need to carefully balance fountain solution and lithographic printing ink and can carry out their operations with less training.

Positive-working waterless printing plates have been prepared from imageable elements containing a negative-working diazo resin and UV irradiation. Negative-working waterless printing plates have been obtained using UV irradiation and diazonaphthoquinone-containing imageable elements or acid-catalyzed chemistries.

The majority of the early waterless printing plates were prepared using a photographic film. The use of such films is expensive and tedious. These disadvantages were addressed in recent years with "computer-to-press" (CTP) technologies whereby waterless printing plates are imaged directly by computer-generated signals using one or more lasers.

One method for preparing waterless printing plates includes generating a contact mask on a radiation-sensitive imageable element. The mask can be produced, for example, using a digital device such as an inkjet printer, electrographic printer, or any other apparatus containing a digitally-controlled laser. Laser ablation, laser ablative transfer, or laser-induced color change techniques can also be used to produce the mask. However, the use of masks to produce waterless printing plates is expensive and requires complicated processing methods.

Two commercial types of thermal (computer-to-plate, or "CTP") waterless printing systems are known. One waterless printing system includes imaging by laser ablation that includes a destructive breaking away or volatilization and removal of the matter in the imaged layer(s). Ablative imaging requires very high imaging energy (the imageable elements have relatively slow imaging speed) and creates considerable debris and gaseous effluents that must be captured or released into the environment. U.S. Pat. No. 5,339,737 (Lewis et al.) and U.S. Pat. No. 5,353,705 (Lewis et al.) describe multi-layer ablatable elements and imaging systems for making waterless printing plates.

Another waterless printing system requires thermal imaging with a laser (perhaps through a mask) to solubilize imaged layers that are then removed in imaged regions by using a developer that often contains an organic solvent or by using a pretreatment solution, or both, as described, for example in U.S. Pat. No. 4,342,820 (Kinashi et al.), U.S. Pat. No. 6,074,797 (Suezawa et al.), U.S. Pat. No. 6,284,433 (Ichikawa et al.), and U.S. Pat. No. 6,964,841 (Tihara et al.).

U.S. Pat. No. 5,919,600 (Huang et al.) describes a two-layer non-ablative imageable element that can be used to provide waterless printing plates using solvent-containing developers to remove the solubilized imageable layer and overlying silicone layer.

Problem to be Solved

Waterless printing is a desired printing technique that can be used without a fountain solution and provide several advantages. Thus, there is a need for imageable elements that can be used to provide waterless printing plates without ablation imaging and development using developers that contain predominantly organic solvents. It is also desired that when silicone is removed from the element during development, silicone debris removed in small pieces that do not clog the processor.

SUMMARY OF THE INVENTION

This invention provides a non-ablative negative-working imageable element comprising a substrate having thereon, in order:

a first layer comprising a first polymeric binder and an infrared radiation absorbing compound, a second layer comprising a second polymeric binder and that is substantially free of infrared radiation absorbing compound, and a crosslinked silicone rubber layer disposed over the second layer.

In some embodiments, the crosslinked silicone rubber layer is derived from either Composition I or Composition II that are defined as follows:

Composition I that comprises:

a) a polysiloxane material having predominantly dimethylsiloxane units and siloxane units represented by the following Structure (PSR):

(PSR)

wherein $R_1$ and $R_2$ are independently alkyl, aryl, and alkenyl groups as long as at least one is an alkenyl group, b) a silane crosslinking agent having SiH groups,
c) a platinum catalyst, and
d) optionally a stabilizer, or adhesion promoter, or both, Composition II that comprises:

a) a polydimethylsiloxane having SiOH, $SiOR_3$, or $SiOCOR_4$ terminal groups, or any combination thereof, wherein $R_3$ and $R_4$ are independently substituted or unsubstituted alkyl, alkenyl, or aryl groups, b) a siloxane crosslinking agent having at least two of any of the SiOH, $SiOR_3$, or $SiOCOR_4$ groups, wherein $R_3$ and $R_4$ are as defined above, and c) optionally a catalyst, adhesion promoter, or both.

This invention also provides a method of making an imaged element suitable for waterless printing, the method comprising, without ablation:

A) imagewise exposing the imageable element of this invention using infrared radiation to provide both exposed and non-exposed regions in the imageable element, and B) removing the silicone rubber layer in predominantly only the exposed regions to provide an imaged element.

In other aspects of this invention a method of making printed images by waterless printing comprising, without ablation:

A) imagewise exposing the imageable element of this invention using infrared radiation to provide both exposed and non-exposed regions in the imageable element, B) removing the crosslinked silicone rubber layer and second layer in predominantly only the exposed regions to provide an imaged element, and C) contacting the imaged element on-press with only a lithographic printing ink.

In some embodiments of the method of this invention, the silicone rubber layer has a thickness of from about 0.5 to about 3.5 μm and comprises a crosslinked silicone rubber that is derived from either Composition I or Composition II described above, the infrared radiation absorbing compound is an IR absorbing dye that is present only in the first layer in an amount of at least 5 weight %, and the $T_g$ of the first polymeric binder in the first layer is higher than the $T_g$ of the second polymeric binder in the second layer by at least 10° C.

The present invention provides a non-ablative imageable element that can be used in a simple method to provide negative images for waterless printing. This invention provides a means for achieving numerous advantages from waterless printing while avoiding the known disadvantages from current techniques. For example, imaging in this invention is carried out without ablation. Moreover, development of the imaged element does not require an organic-solvent-containing developer.

The novel elements of this invention have least two polymer layers under a crosslinked, ink-repelling silicone rubber layer. Only the layer closest to the substrate under the crosslinked silicone rubber layer contains an infrared radiation absorbing compound that provides thermal sensitivity.

During imaging, thermal energy breaks the bond between the crosslinked silicone rubber layer and the underlying polymer layer(s). Without being bound to any mechanism, it is believed that thermal imaging melts the layer directly underneath the crosslinked silicone rubber layer and forms holes that cause a disconnection with the crosslinked silicone rubber layer. Use of a simple solution such as water or an aqueous alkaline solution will remove the imaged crosslinked silicone rubber layer and one or both of the underlying polymer layers to provide ink-accepting regions. In some embodiments, no developing solution is needed and the layer materials are removed using mechanical means.

We also found that the silicone debris is removed during development in relatively small pieces so that clogging of the processor is less likely.

We further found that the non-ablative imageable elements of this invention have high imaging speed and can be imaged using an imaging energy as low as 110 $mJ/cm^2$, which is considerably lower than the energy generally used for ablation imaging.

DETAILED DESCRIPTION OF THE INVENTION

Definitions

Unless the context indicates otherwise, when used herein, the terms "non-ablative imageable element", "imageable element" and "printing plate precursor" are meant to be references to embodiments of the present invention.

In addition, unless the context indicates otherwise, the various components described herein such as "first polymeric binder", "second polymeric binder", "radiation absorbing compound", "IR dye", "polysiloxane material", "silane crosslinking agent", "polydimethylsiloxane", "catalyst", "adhesion promoter", and similar terms also refer to mixtures of such components. Thus, the use of the article "a" or "an" is not necessarily meant to refer to only a single component.

By the term "remove predominantly only said exposed regions" during development, we mean that the exposed regions of the second and silicone rubber layers and optionally the first layer are selectively and preferentially removed during processing, but not the non-exposed regions to any significant extent (there may be insubstantial removal of the non-exposed regions).

By "computer-to-press", we mean the imaging means is carried out using a computer-directed imaging means (such as a laser) directly to the imageable element without using masking or other intermediate imaging films.

By "non-ablative", we mean that the thermally imaged regions are not substantially volatilized or removed by mere imaging alone and little volatile fragments and gases are generated during thermal imaging in the practice of this invention.

Unless otherwise indicated, percentages refer to percents by dry weight, either the dry solids of an imageable layer formulation or the dry coated weight of a layer (for example, first, second, or silicone rubber layer). Unless otherwise indicated, the weight percent values can be interpreted as for either a layer formulation or a dried layer coating.

For clarification of definitions for any terms relating to polymers, reference should be made to "Glossary of Basic Terms in Polymer Science" as published by the International Union of Pure and Applied Chemistry ("IUPAC"), *Pure Appl. Chem.* 68, 2287-2311 (1996). However, any definitions explicitly set forth herein should be regarded as controlling.

Unless otherwise indicated, the term "polymer" refers to high and low molecular weight polymers including oligomers and includes homopolymers and copolymers.

The term "copolymer" refers to polymers that are derived from two or more different monomers. That is, they comprise recurring units having at least two different chemical structures.

The term "backbone" refers to the chain of atoms in a polymer to which a plurality of pendant groups can be attached. An example of such a backbone is an "all carbon" backbone obtained from the polymerization of one or more ethylenically unsaturated polymerizable monomers. However, other backbones can include heteroatoms wherein the polymer is formed by a condensation reaction or some other means.

Uses

The imageable elements described herein can be used in a number of ways such as precursors to lithographic printing plates (or "printing plate blanks") as described in more detail below. However, this is not meant to be their only use. For example, the imageable elements can also be used as thermal patterning systems and to form masking elements and printed circuit boards.

Imageable Elements

In general, the imageable elements comprise a substrate, a first layer, a second layer disposed over the first layer, a crosslinked silicone rubber layer, and an optional protective layer over the crosslinked silicone rubber layer.

In some embodiments:

a) the substrate has a different color tone than the combined color tone of the first and second layers, b) the first and second layers have different color tones, or c) both the substrate has a different color tone than the combined color tone of the first and second layers, and the first and second layers have different color tones.

Colorants can be incorporated into the first and second layers in suitable amounts to control color tone. Color tone of the substrate is generally provided by the specific material (for example, metal) that is used or by anodizing aluminum or other metal surfaces.

Substrate:

The imageable elements are formed by suitable application of a first layer formulation or composition onto a suitable substrate. This substrate can be a raw support material but it is usually treated or coated in various ways to make it less reflective and thereby easier for image inspection for quality purposes prior to application of the first layer composition as well as to improve adhesion to overlying layers. The substrate comprises a support that can be composed of any material that is conventionally used to prepare imageable elements such as lithographic printing plates. The substrate can be treated to provide an "interlayer" for improved adhesion and the first layer formulation is applied over the interlayer.

The substrate is usually in the form of a sheet, film, or foil, and is strong, stable, and flexible and resistant to dimensional change under conditions of use so that color records will register a full-color image. Typically, the support can be any self-supporting material including polymeric films (such as polyester, polyethylene, polycarbonate, cellulose ester polymer, and polystyrene films), glass, ceramics, metal sheets or foils, or stiff papers (including resin-coated and metallized papers), or a lamination of any of these materials (such as a lamination of an aluminum foil onto a polyester film). Metal supports include sheets or foils of aluminum, copper, zinc, titanium, and alloys thereof.

Polymeric film supports may be modified on one or both surfaces with a "subbing" layer to enhance adhesion or reflective properties, or paper supports may be similarly coated to enhance planarity. Examples of subbing layer materials include but are not limited to, alkoxysilanes, amino-propyl-triethoxysilanes, glycidioxypropyl-triethoxysilanes, and epoxy functional polymers, as well as conventional subbing materials.

A useful substrate is composed of an aluminum-containing support that may be coated or treated using techniques known in the art, including physical graining, electrochemical graining, chemical graining, and anodizing.

An optional interlayer may be formed by treatment of the aluminum support with, for example, a silicate, dextrine, calcium zirconium fluoride, hexafluorosilicic acid, phosphate/fluoride, poly(vinyl phosphonic acid) (PVPA), vinyl phosphonic acid-acrylic acid copolymer, poly(acrylic acid), or (meth)acrylic acid copolymer, or mixtures thereof.

The thickness of the substrate can be varied but should be sufficient to sustain the wear from printing and thin enough to wrap around a printing form. Such embodiments typically include a treated aluminum foil having a thickness of from about 100 to about 600 μm.

The backside (non-imaging side) of the substrate may be coated with antistatic agents and/or slipping layers or a matte layer to improve handling and "feel" of the imageable element.

The substrate can also be a cylindrical surface having the layer compositions applied thereon, and thus be an integral part of the printing press or a sleeve that is incorporated onto a press cylinder. The use of such imaged cylinders is described for example in U.S. Pat. No. 5,713,287 (Gelbart).

First Layer:

The first layer is disposed between the second layer and the substrate. Typically, it is disposed directly on the substrate (including any coatings as described above). The first layer comprises a first polymeric binder that may be partially or totally removed during development depending upon the type of imaging procedure (described below). In addition, the first polymeric binder is usually insoluble in the solvent used to coat the second layer so that the second layer can be coated over the first layer without dissolving the first layer. Mixtures of these first polymeric binders can be used if desired in the first layer.

It is advantageous that the polymeric binders used in the first layer have high resistance to the chemical solvents that may be used in development and to lithographic printing inks and printing press cleaning fluids. Such resistance can be measured by dipping the element for various periods of time in a specific solvent or chemical and measuring the weight of the remaining coating. A higher remaining coating weight is an indication of higher chemical resistance.

For example, solvent resistance of the first layer can be evaluated by soaking a coated and dried first layer formulation (on an aluminum substrate) for 5 minutes in a 80:20 weight mixture of 2-butoxyethanol (Butyl Cellusolve) and water at room temperature, and measuring the percentage weight loss of that layer after it is dried again. For example, a first layer formulation has the desired solvent resistance when the coating weight loss using the noted test is less than 35%. However, any improvement in chemical resistance is evident when the coating weight loss is less than a known layer formulation. Butyl Cellusolve is a solvent commonly used in UV washes (the fluids used to clean UV inks from printing plates and blanket rollers on-press). Other glycol ethers are sometimes used in UV washes but it is believed that resistance to Butyl Cellusolve in the noted mixture is a good indicator of chemical resistance to all solvents used during printing, especially when UV inks are used in printing.

Useful first polymeric binders for the first layer include recurring units derived from one or more of (meth)acrylonitrile or N-substituted cyclic imides (such as N-phenyl maleimide, N-cyclohexyl maleimide, N-(4-carboxyphenyl)maleimide, N-benzylmaleimide, or a mixture thereof), and optionally comprising recurring units derived from a (meth) acrylamide such as acrylamide, methacrylamide, N-alkoxy-alkyl methacrylamide, N-hydroxy methylacrylamide and N-hydroxymethyl methacrylamide. For example, the first polymer may be derived at least in part from an N-substituted cyclic imide, a (meth)acrylonitrile, and a (meth)acrylamide. For example, the amount of recurring units derived from a (meth)acrylonitrile can be from about 20 to about 50 mol %, the amount of recurring units derived from an N-substituted cyclic imide can be from about 20 to about 75 mol %, and the amount of recurring units derived from other monomers such as a (meth)acrylamide can be from 0 to about 50 mol %.

The first layer may also comprise one or more secondary polymeric materials that are resins having activated methylol and/or activated alkylated methylol groups as long as the chemical resistance test noted above is still met. These "secondary polymeric materials" in the first layer should not be confused with the "second polymeric binder" used in the second layer.

The secondary polymeric materials can include, for example resole resins and their alkylated analogs, methylol melamine resins and their alkylated analogs (for example melamine-formaldehyde resins), methylol glycoluril resins and alkylated analogs (for example, glycoluril-formaldehyde resins), thiourea-formaldehyde resins, guanamine-formaldehyde resins, and benzoguanamine-formaldehyde resins. Commercially available melamine-formaldehyde resins and glycoluril-formaldehyde resins include, for example, CYMEL® resins (Dyno Cyanamid) and NIKALAC® resins (Sanwa Chemical).

The resin having activated methylol and/or activated alkylated methylol groups is preferably a resole resin or a mixture of resole resins. Resole resins are well known to those skilled in the art. They are prepared by reaction of a phenol with an aldehyde under basic conditions using an excess of phenol. Commercially available resole resins include, for example, GP649D99 resole (Georgia Pacific) and BKS-5928 resole resin (Union Carbide).

Useful secondary polymeric materials can also include copolymers that comprise from about 25 to about 75 mole % of recurring units derived from N-phenylmaleimide, from about 10 to about 50 mole % of recurring units derived from methacrylamide, and from about 5 to about 30 mole % of recurring units derived from methacrylic acid. These secondary additional copolymers are disclosed in U.S. Pat. Nos. 6,294,311 and 6,528,228 (both noted above).

The first polymeric binder and the secondary polymeric materials useful in the first layer can be purchased from several commercial sources or prepared by methods, such as free radical polymerization, that are well known to those skilled in the art and that are described, for example, in Chapters 20 and 21, of *Macromolecules*, Vol. 2, 2nd Ed., H. G. Elias, Plenum, New York, 1984. The first polymeric binders described above generally comprise at least 50 weight % and typically from about 60 to about 90 weight % and this amount can be varied depending upon what other polymers and chemical components are present. Any secondary polymeric materials (such as a novolak, resole, or copolymers noted above) can be present in an amount of from about 5 to about 45 weight %.

The first layer can also include other components such as surfactants, dispersing aids, humectants, biocides, viscosity builders, drying agents, defoamers, preservatives, antioxidants, and colorants.

The first layer also includes one or more infrared radiation absorbing compounds ("IR absorbing compounds") that absorb radiation from about 600 to about 1500 nm and typically from about 700 to about 1200 nm with minimal absorption at from about 300 to about 600 nm.

Examples of suitable IR dyes include but are not limited to, azo dyes, squarylium dyes, triarylamine dyes, thioazolium dyes, indolium dyes, oxonol dyes, oxazolium dyes, cyanine dyes, merocyanine dyes, phthalocyanine dyes, indocyanine dyes, indotricarbocyanine dyes, hemicyanine dyes, streptocyanine dyes, oxatricarbocyanine dyes, thiocyanine dyes, thiatricarbocyanine dyes, merocyanine dyes, cryptocyanine dyes, naphthalocyanine dyes, polyaniline dyes, polypyrrole dyes, polythiophene dyes, chalcogenopyryloarylidene and bi(chalcogenopyrylo)-polymethine dyes, oxyindolizine dyes, pyrylium dyes, pyrazoline azo dyes, oxazine dyes, naphthoquinone dyes, anthraquinone dyes, quinoneimine dyes, methine dyes, arylmethine dyes, polymethine dyes, squaraine dyes, oxazole dyes, croconine dyes, porphyrin dyes, and any substituted or ionic form of the preceding dye classes. Suitable dyes are described for example, in U.S. Pat. No. 4,973,572 (DeBoer), U.S. Pat. No. 5,208,135 (Patel et al.), U.S. Pat. No. 5,244,771 (Jandrue Sr. et al.), and U.S. Pat. No. 5,401,618 (Chapman et al.), and EP 0 823 327A1 (Nagasaka et al.).

Cyanine dyes having an anionic chromophore are also useful. For example, the cyanine dye may have a chromophore having two heterocyclic groups. In another embodiment, the cyanine dye may have at least two sulfonic acid groups, more particularly two sulfonic acid groups and two indolenine groups. Useful IR-sensitive cyanine dyes of this type are described for example in U.S. Patent Application Publication 2005-0130059 (Tao). A general description of one class of suitable cyanine dyes is shown by the formula in paragraph 0026 of WO 2004/101280 (Munnelly et al.).

In addition to low molecular weight IR-absorbing dyes, IR dye moieties bonded to polymers can be used as well. Moreover, IR dye cations can be used as well, that is, the cation is the IR absorbing portion of the dye salt that ionically interacts with a polymer comprising carboxy, sulfo, phospho, or phosphono groups in the side chains.

Near infrared absorbing cyanine dyes are also useful and are described for example in U.S. Pat. No. 6,309,792 (Hauck et al.), U.S. Pat. No. 6,264,920 (Achilefu et al.), U.S. Pat. No. 6,153,356 (Urano et al.), and U.S. Pat. No. 5,496,903 (Watanabe et al.). Suitable dyes may be formed using conventional methods and starting materials or obtained from various commercial sources including American Dye Source (Baie D'Urfe, Quebec, Canada) and FEW Chemicals (Germany). Other useful dyes for near infrared diode laser beams are described, for example, in U.S. Pat. No. 4,973,572 (noted above).

Useful IR absorbing compounds include various pigments including carbon blacks such as carbon blacks that are surface-functionalized with solubilizing groups are well known in the art. Carbon blacks that are grafted to hydrophilic, nonionic polymers, such as FX-GE-003 (manufactured by Nippon Shokubai), or which are surface-functionalized with anionic groups, such as CAB-O-JET® 200 or CAB-O-JET® 300 (manufactured by the Cabot Corporation) are also useful. Other useful pigments include, but are not limited to, Heliogen Green, Nigrosine Base, iron (III) oxides, manganese oxide, Prussian Blue, and Paris Blue. The size of the pigment particles should not be more than the thickness of the imageable layer.

The radiation absorbing compound is generally present in the imageable element in an amount of at least 5% and up to 30 weight % and typically from about 8 to about 25 weight % (based on total dry layer weight). The particular amount needed for this purpose would be readily apparent to one skilled in the art, depending upon the specific compound used and the properties of the alkaline developer to be used.

The first layer can also include other components such as surfactants, dispersing aids, humectants, biocides, viscosity builders, drying agents, defoamers, preservatives, antioxidants, and colorants, or combinations thereof, all in known amounts. The first layer can also be crosslinked with suitable crosslinking agents such as divinyl benzene.

The first layer generally has a dry coating coverage of from about 0.5 to about 5 g/m$^2$ and typically from about 0.7 to about 3 g/m$^2$.

Second Layer:

The second layer of the imageable element is disposed over the first layer and in most embodiments there are no intermediate layers between the first and second layers. The second layer is substantially free of infrared radiation absorbing compounds (less than 3 weight %), meaning that none of these compounds are purposely incorporated therein and insubstantial amounts diffuse into it from other layers.

The one or more second polymeric binders are generally present in the second layer at a dry coverage of from about 50 to 100 weight % and typically from about 70 to about 98 weight %. The materials in the second layer including the polymeric binders contribute to the layer's thermal sensitivity. In other words, the second layer is readily deformed and destabilized by the thermal imaging used in the accordance with this invention.

The second polymeric binders used in the second layer are generally meltable with thermal imaging. The $T_g$ of the first polymeric binder (or mixture thereof) in the first layer is higher than the $T_g$ of the second polymeric binder (or mixture thereof) in the second layer by at least 10, and typically by at least 25° C. $T_g$ can be measured using Thermal Mechanical Analysis or Differential Scanning Calorimetry.

The second polymeric binders used in the second layer can be chosen at least from one or more of the following seven classes of polymers:
  a) novolak resins, resole resins, branched or unbranched polyhydroxystyrenes (or polyvinyl phenols), polyvinyl acetals with pendant phenol groups, and any combination thereof,
  b) polymers having recurring units derived from one or more monomers of group (a) that is selected from the group consisting norbornene, tetracyclododecene, and mixtures thereof, and recurring units derived from one or more monomers of group (b) that is selected from the group consisting of maleic anhydride, maleimide, N-phenyl maleimide, N-benzyl maleimide, N-cyclohexyl maleimide, and mixtures thereof,
  c) copolymers derived from maleic anhydride and monomers of the formula $CH_2=CH(C_6H_4R^1)$ and mixtures thereof in which $R^1$ is hydrogen, halogen, hydroxyl, cyano, sulfonamide, alkyl of 1 to 6 carbon atoms, alkoxyl of 1 to 6 carbon atoms, acyl of 1 to 7 carbon atoms, acyloxy of 1 to 7 carbon atoms, carboalkoxy of 1 to 7 carbon atoms, or a mixture thereof,
  d) copolymers derived from methyl methacrylate and a carboxylic acid containing monomer or a mixture of carboxylic acid containing monomers,
  e) polymers having an $—X—C(=T)-NR—S(=O)_2—$ moiety that is attached to the polymer backbone, wherein —X— is an oxy or —NR'— group, T is O or S, R and R' are independently hydrogen, halo, or an alkyl group having 1 to 6 carbon atoms, and
  f) polymers having recurring units represented by the following Structure (I-F) or (II-F):

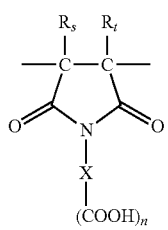

(I-F)

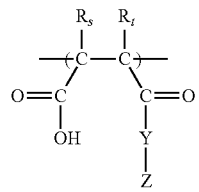

(II-F)

wherein n is 1 to 3, $R^s$ and $R_t$ are independently hydrogen or an alkyl or halo group, X is a multivalent linking group, Y is oxy or —NR— wherein R is hydrogen or an alkyl or aryl group, and Z is a monovalent organic group.

Class a) Polymers:

Examples of Class a) polymers include but are not limited to, poly(hydroxystyrenes), novolak resins, resole resins, poly(vinyl acetals) having pendant phenolic groups, and mixtures of any of these resins (such as mixtures of one or more novolak resins and one or more resole resins). The novolak resins are most preferred.

Generally, such resins have a number average molecular weight of at least 3,000 and up to 200,000, and typically from about 6,000 to about 100,000, as determined using conventional procedures. Most of these types of resins are commercially available or prepared using known reactants and procedures. For example, the novolak resins can be prepared by the condensation reaction of a phenol with an aldehyde in the presence of an acid catalyst. Typical novolak resins include but are not limited to, phenol-formaldehyde resins, cresol-formaldehyde resins, phenol-cresol-formaldehyde resins, p-t-butylphenol-formaldehyde resins, and pyrogallol-acetone resins, such as novolak resins prepared from reacting m-cresol or a m,p-cresol mixture with formaldehyde using conventional conditions. For example, some useful novolak resins include but are not limited to, xylenol-cresol resins, for example, SPN400, SPN420, SPN460, and VPN1100 (that are available from AZ Electronics) and EP25D40G and EP25D50G that have higher molecular weights, such as at least 4,000.

Other useful Class a) resins include polyvinyl compounds having phenolic hydroxyl groups, such as poly(hydroxystyrenes) and copolymers containing recurring units of a hydroxystyrene and polymers and copolymers containing recurring units of substituted hydroxystyrenes.

Also useful are branched poly(hydroxystyrenes) having multiple branched hydroxystyrene recurring units derived from 4-hydroxystyrene as described for example in U.S. Pat. No. 5,554,719 (Sounik) and U.S. Pat. No. 6,551,738 (Ohsawa et al.), and U.S. Published Patent Applications 2003/0050191 (Bhatt et al.) and 2005/0051053 (Wisnudel et al.), and in copending and commonly assigned U.S. patent application Ser. No. 11/474,020 (filed Jun. 23, 2006 by Levanon et al.), that is incorporated herein by reference. For example, such branched hydroxystyrene polymers comprise recurring units derived from a hydroxystyrene, such as from 4-hydroxystyrene, which recurring units are further substituted with repeating hydroxystyrene units (such as 4-hydroxystyrene units) positioned ortho to the hydroxy group. These branched polymers can have a weight average molecular weight ($M_w$) of from about 1,000 to about 30,000, typically from about 1,000 to about 10,000, or from about 3,000 to about 7,000. In addition, they may have a polydispersity less than 2 and typically from about 1.5 to about 1.9. The branched poly(hydroxystyrenes) can be homopolymers or copolymers with non-branched hydroxystyrene recurring units.

Some useful poly(hydroxystyrenes) are described in EP 1,669,803A (Barclay et al.).

Other useful polymeric binders are modified novolak or resole resins that are represented in the following Structure (POLYMER):

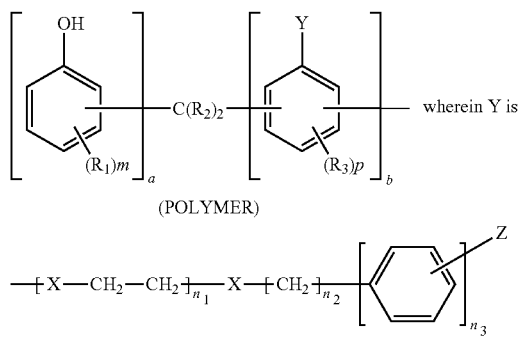

(POLYMER)

$-\!\!\!+\!\!X\!-\!\!CH_2\!-\!\!CH_2\!\!\cdot\!\!]_{n_1}\!-\!\!X\!-\!\!+\!\!CH_2\!\!\cdot\!\!]_{n_2}\!\!\cdot\!\!\underset{n_3}{\underbrace{\phantom{CH_2}}}^Z$ a is from about 90 to about 99 mol % (typically from about 92 to about 98 mol %), b is from about 1 to about 10 mol % (typically from about 2 to about 8 mol %), $R_1$ and $R_3$ are independently hydrogen or hydroxy, alkyl, or alkoxy groups, $R_2$ is hydrogen or an alkyl group, X is an alkylene, oxy, thio, —OC(=O)Ar—, —OC(=O)CH=CH—, or —OCO $(CH_2)_{n4}$— group wherein Ar is an aryl group, m and p are independently 1 or 2, n, is 0 or an integer up to 5 (for example 0, 1, 2, or 3), $n_2$ is 0 or an integer up to 5 (for example, 0, 1, or 2), $n_3$ is 0 or 1 (typically 0), $n_4$ is at least 1 (for example, up to 8), and Z is —C(=O)OH, —S(=O)$_2$OH, —P(=O)(OH)$_2$, or —OP(=O)(OH)$_2$.

The alkyl and alkoxy groups present in the primary polymeric binders (for $R^1$, $R^2$, and $R^3$) can be unsubstituted or substituted with one or more halo, nitro, or alkoxy groups, and can have 1 to 3 carbon atoms. Such groups can be linear, branched, or cyclic (that is, "alkyl" also include "cycloalkyl" for purposes of this invention).

When X is alkylene, it can have 1 to 4 carbon atoms and be further substituted similarly to the alkyl and alkoxy groups. In addition, the alkylene group can be a substituted or unsubstituted cycloalkylene group having at least 5 carbon atoms in the ring and chain. Ar is a substituted or unsubstituted, 6 or 10-membered carbocyclic aromatic group such as substituted or unsubstituted phenyl and naphthyl groups. Typically, Ar is an unsubstituted phenyl group.

In some embodiments, the polymeric binder comprises recurring units represented by Structure (POLYMER) wherein a is from about 92 to about 98 mol %, b is from about 2 to about 8 mol % and Z is —C(=O)OH, and is present at a dry coverage of from about 15 to 100 weight % based on the total dry weight of the layer.

Class b) Polymers:

Examples of Class b) polymers include but are not limited to the co-polymers derived at least in part from group $(a_1)$ monomer described below and group $(b_1)$ monomer described below with at least about 15 mol % of recurring units from the group $(a_1)$ monomers and at least about 10 mol % of recurring units from the group $(b_1)$ monomers. When electron deficient olefins, such as maleic anhydride or a maleimide are used as group $(b_1)$ monomer, 1:1 alternating co-polymers (that is, 50 mol % of the group $(a_1)$ monomer and 50 mol % of the group $(b_1)$) are typically produced.

Group $(a_1)$ monomers include norbornene and norbornene derivatives such as:

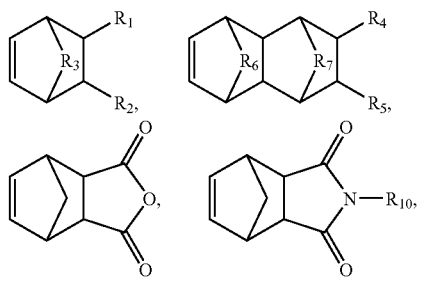

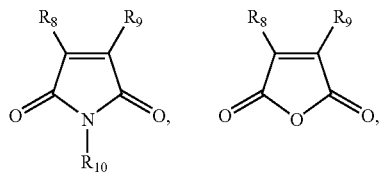

and mixtures thereof.

Group $(b_1)$ monomers include:

acrylonitrile, methacrylonitrile, styrene, hydroxystyrene, $CH(R_{11})CH[C(=O)OR_{12}]$, $CH(R_{11})CH(CON(R_{12})_2)$, $CH_2CH(OR_{12})$, and mixtures thereof $R_1$, $R_2$, $R_4$, and $R_5$ are each independently hydrogen, phenyl, substituted phenyl, halogen, alkyl of 1 to 6 carbon atoms, alkoxyl of 1 to 6 carbon atoms, acyl of 1 to 7 carbon atoms, acyloxy of 1 to 7 carbon atoms, carboalkoxy of 1 to 7 carbon atoms, or a mixture thereof. Substituted phenyl groups include, for example, 2-methylphenyl, 3-methylphenyl, 4-methylphenyl, 4-t-butylphenyl, 4-methoxyphenyl, 3-ethoxyphenyl, 4-cyanophenyl, 4-chlorophenyl, 4-fluorophenyl, 4-acetoxyphenyl, 4-carboxyphenyl, 4-carboxymethylphenyl, 4-carboxyethylphenyl, 3,5-dichlorophenyl, and 2,4,6-trimethylphenyl. Halogen includes fluoro, chloro, and bromo. Examples are $CH_3CO$— (acetyl), $CH_3CH_2CO$—, $CH_3(CH_2)_2CO$—, $CH_3(CH_2)_3CO$—, $(CH_3)_3CCO$—, and $(CH_3)_3CCH_2CO$—. Acyloxy groups of 1 to 7 carbon atoms are —OC(=O)R groups in which R is an alkyl group of 1 to 6 carbon atoms, such as are listed above. Examples are $H_3CC$ (=O)O— (acetyloxy), $CH_3CH_2C(=O)O$—, $CH_3(CH_2)_2C$ (=O)O—, $CH_3(CH_2)_3C(=O)O$—, $(CH_3)_3CC(=O)O$—, and $(CH_3)_3CCH_2C(=O)O$—. Carboalkoxy groups of 1 to 7 carbon atoms are —C(=O)OR groups in which R is an alkyl group of 1 to 6 carbon atoms, such as are listed above. Examples are —C(=O)OCH$_3$, (carbomethoxy), —C(=O) OCH$_2$CH$_3$, —C(=O)O(CH$_2$)$_2$CH$_3$, —C(=O)O(CH$_2$)$_3$ CH$_3$, —C(=O)OC(CH$_3$)$_3$ (carbo-t-butoxy), —C(=O) OCH$_2$C(CH$_3$)$_3$, —C(=O)O(CH$_2$)$_4$CH$_3$, and —C(=O)O (CH$_2$)$_5$CH$_3$. $R_3$, $R_6$, and $R_7$ are each —CH$_2$—. Each $R_8$ and $R_9$ is each independently hydrogen or methyl, or a mixture thereof, typically hydrogen. $R_{10}$ is hydrogen, hydroxyl, alkyl of 1 to 6 carbon atoms, phenyl, substituted phenyl, benzyl, or a mixture thereof. Each $R_{11}$ is independently hydrogen, methyl, or a mixture thereof. Each $R_{12}$ is independently hydrogen, alkyl of 1 to 6 carbon atoms, phenyl or a mixture thereof, typically hydrogen, methyl, or a mixture thereof.

More specifically, group $(a_1)$ monomers include but are not limited to, norbornene (bicyclo[2.2.1]hept-2-ene) and its derivatives, such as methyl 5-norbornene-2-carboxylate, t-butyl 5-norbornene-2-carboxylate, and other esters of 5-norbornene-2-carboxylic acid; cis-5-norbornene-endo-2, 3-dicarboxylic anhydride and the corresponding imides, such as the N-methyl, N-hydroxyl, N-phenyl, N-cyclohexyl, and the N-benzyl imides; tetracyclododecene (tetracyclo[4.4.0.1$^{2,5}$.1$^{7,10}$]dodec-3-ene) and its derivatives, such as the esters of (tetracyclo[4.4.0.1$^{2,5}$.1$^{7,10}$]dodec-3-ene-8-carboxylic acid, for example methyl (tetracyclo[4.4.0.1$^{2,5}$.1$^{7,10}$] dodec-3-ene)-8-carboxylate, ethyl (tetracyclo[4.4.0.1$^{2,5}$. 1$^{7,10}$]dodec-3-ene)-8-carboxylate, and t-butyl (tetracyclo [4.4.0.1$^{2,5}$.1$^{7,10}$]dodec-3-ene)-8-carboxylate; (tetracyclo [4.4.0.1$^{2,5}$.1$^{7,10}$]dodec-3-ene-endo-8,9-dicarboxylic acid and its corresponding imides, such as the N-methyl, N-hydroxyl, N-phenyl, N-cyclohexyl, and the N-benzyl imides; and mixtures thereof.

Group (b$_1$) include but are not limited to, acrylonitrile, methacrylonitrile, hydroxystyrene, acrylic acid esters such as methyl acrylate, ethyl acrylate, propyl acrylate, butyl acrylate, and phenyl acrylate; methacrylic acid esters such as methyl methacrylate, ethyl methacrylate, propyl methacrylate, butyl methacrylate, and phenyl methacrylate; methacrylamides and acrylamides, such as methacrylamide, acrylamide, N,N-dimethyl acrylamide, N,N-dimethyl methacrylamide, and the acrylamide and methacrylamide of p-aminobenzoic acid; maleic anhydride; maleic acid imides, such as N-phenylmaleimide, N-cyclohexylmaleimide, N-benzylmaleimide, N-methylmaleimide, N-hydroxymaleimide; vinyl ethers, such as methyl vinyl ether and ethyl vinyl ether; and mixtures thereof.

Further details the Class b) polymers and methods of making them are provided in U.S. Pat. No. 6,969,570 (Kitson).

Class c) Polymers:

Examples of Class c) polymers include but are not limited to, copolymers derived at least in part from maleic anhydride and styrene or a substituted styrene or a mixture of substituted styrenes (styrene derivatives). Recurring units derived from maleic anhydride typically comprises from about 1 to about 50 mol % and more likely from about 15 to about 50 mol % of the co-polymer.

Typically, the styrene and substituted styrene can be represented by the formula CH$_2$=CH(C$_6$H$_4$R$^1$). The substituent R$^1$ may be o-, m-, or p- to the vinyl (CH$_2$=CH—) group. R$^1$ can be hydrogen, halogen, hydroxyl, cyano, sulfonamide, alkyl of 1 to 6 carbon atoms, alkoxyl of 1 to 6 carbon atoms, acyl of 1 to 7 carbon atoms, acyloxy of 1 to 7 carbon atoms, carboalkoxy of 1 to 7 carbon atoms, or a mixture thereof. Halogen includes fluoro, chloro, and bromo. An example of a sulfonamide group is —S(=O)$_2$NH$_2$. Acyl groups of 1 to 7 carbon atoms are —C(=O)R groups in which R is an alkyl group of 1 to 6 carbon atoms, such as are listed above. Examples are CH$_3$CO— (acetyl), CH$_3$CH$_2$CO—, CH$_3$(CH$_2$)$_2$CO—, CH$_3$(CH$_2$)$_3$CO—, (CH$_3$)$_3$CCO—, and (CH$_3$)$_3$CCH$_2$CO—. Acyloxy groups of 1 to 7 carbon atoms are —OC(=O)R groups in which R is an alkyl group of 1 to 6 carbon atoms, such as are listed above. Examples are H$_3$CC(=O)O— (acetyloxy), CH$_3$CH$_2$C(=O)O—, CH$_3$(CH$_2$)$_2$C(=O)O—, CH$_3$(CH$_2$)$_3$C(=O)O—, (CH$_3$)$_3$CC(=O)O—, and (CH$_3$)$_3$CCH$_2$C(=O)O—. Carboalkoxy groups of 1 to 7 carbon atoms are —CO$_2$R groups in which R is an alkyl group of 1 to 6 carbon atoms, such as are listed above. Examples are —C(=O)OCH$_3$, (carbomethoxy), —C(=O)OCH$_2$CH$_3$ (carboethoxy), —C(=O)O(CH$_2$)$_2$CH$_3$, —C(=O)O(CH$_2$)$_3$CH$_3$, —C(=O)OC(CH$_3$)$_3$ (carbo-t-butoxy), —C(=O)OCH$_2$C(CH$_3$)$_3$, —C(=O)O(CH$_2$)$_4$—CH$_3$, and —C(=O)O(CH$_2$)$_5$CH$_3$. A useful monomer is styrene wherein R$_1$ is hydrogen in the noted formula.

Recurring units derived from additional monomers, such as acrylate and methacrylate monomers (such as methyl acrylate, ethyl acrylate, ethyl methacrylate, butyl acrylate, and butyl methacrylate), acrylonitrile; methacrylonitrile, methacrylamides (such as methacrylamide and N,N-dimethyl methacrylamide), and acrylamides (such as acrylamide and N,N-dimethyl acrylamide), may also be present, but are not required.

Further details of Class c) copolymers and methods of making them are provided for example in U.S. Patent Application Publication 2007/0065737 (Kitson et al.).

Class d) Polymers:

Examples of Class d) polymers include but are not limited to, copolymers are derived at least in part from methyl methacrylate and a carboxylic acid containing monomer, typically a carboxylic acid containing monomer of 14 or fewer carbon atoms, more typically a carboxylic acid containing monomer of 9 or fewer carbon atoms. A mixture of carboxylic acid containing monomers may also be used. Typical carboxylic acid containing monomers are acrylic acid, methacrylic acid, 3-vinyl benzoic acid, 4-vinyl benzoic acid, itaconic acid, maleic acid, and monomers formed by the reaction of a hydroxyl containing monomer, such as 2-hydroxyethyl acrylate or 2-hydroxyethyl methacrylate with a cyclic anhydride such as succinic anhydride or phthalic anhydride. A particularly useful carboxylic acid containing monomer is methacrylic acid.

The molar ratio of recurring units derived from methyl methacrylate to the recurring units derived from carboxylic acid containing monomer(s) is generally from about 80:20 to about 98:2 and typically from about 90:10 to about 95:5.

Recurring units derived from additional monomers, such as acrylate and other methacrylate monomers (such as methyl acrylate, ethyl acrylate, ethyl methacrylate, butyl acrylate, and butyl methacrylate), maleic anhydride, vinyl ethers (such as methyl vinyl ether), acrylonitrile, methacrylonitrile, methacrylamides (such as methacrylamide and N,N-dimethyl methacrylamide), and acrylamides (such as acrylamide and N,N-dimethyl acrylamide), may also be present, but are not required. Typically, the co-polymer consists essentially of the methyl methacrylate and the carboxylic acid containing monomer or mixture of carboxylic acid containing monomers. The molecular weights of the Class d) copolymers are generally less than 200,000. Further details of the Class d) copolymers and methods of making them are also provided for example in U.S. Patent Application Publication 2007/0065737 (Kitson et al.).

Class e) Polymers:

Examples of Class e) polymers include but are not limited to, polymeric binders having a pKa of from about 6 to about 9 (typically from about 6 to about 8) that comprise a variety of groups (usually groups pendant to the polymer backbone) that are either directly or indirectly attached to the polymer backbone in sufficient quantity that will provide the desired pKa including, but not limited to, mercapto groups, sulfonamido groups, and N-substituted sulfonamido groups (including but not limited to, alkyl, acyl, alkoxycarbonyl, alkylaminocarbonyl, and β-keto ester substituted sulfonamido groups), α-cyano esters, α-cyano ketones, beta-diketones, and α-nitro esters. The unsubstituted and substituted sulfonamido groups are useful. These polymers can also comprise a mixture of the noted pendant groups along the polymer backbone.

More particularly, each of the Class e) polymers can comprise a polymer backbone and an —X—C(=T)-NR—S(=O)$_2$— moiety that is attached to and along the polymer backbone, wherein —X— is an oxy (—O—) or —NR'— group, T is O (forming an oxo group) or S (forming a thioxo group), and R and R' are independently hydrogen, halo, or a substituted or unsubstituted alkyl group having 1 to 6 carbon atoms. For example, R is hydrogen, T is O, and X is an oxy or —NH— group.

In some embodiments, the Class e) polymers comprise one or more acrylic resins that are derived from one or more ethylenically unsaturated polymerizable monomers, at least one of which monomers comprises pendant —X—C(=T)-NR—S(=O)$_2$—R$^3$ groups that are defined below.

More particularly, the Class e) polymers can be represented by the following Structure (E):

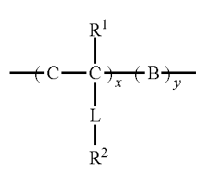

(E)

wherein R$^1$ is hydrogen, a substituted or unsubstituted alkyl group having 1 to 6 carbon atoms (such as methyl, ethyl, chloromethyl, iso-propyl and benzyl), or a halo group (such as fluoro, chloro, or bromo). For example, R$^1$ is hydrogen or a substituted or unsubstituted methyl or chloro group, or it is hydrogen or unsubstituted methyl.

R$^2$ represents the —X—C(=T)-NR—S(=O)$_2$—R$^3$ group wherein X, T, and R are as defined above, and R$^3$ is a substituted or unsubstituted aliphatic group or a substituted or unsubstituted aryl group directly attached to —S(=O)$_2$- through a carbon atom. More particularly, R$^3$ can represent a substituted or unsubstituted alkyl group having 1 to 12 carbon atoms, a substituted or unsubstituted cycloalkylene group having 5 to 10 carbon atoms in the ring, a substituted or unsubstituted aryl group having 6 to 10 carbon atoms in the ring, or a substituted or unsubstituted heterocyclyl group, or any combinations of such groups that are linked directly together, or linked together with oxy, carbonyl, amido, thio, or other groups that would be readily apparent to one skilled in the art. For example, R$^3$ is a substituted or unsubstituted phenyl group.

L is a direct bond or a linking group, including but not limited to substituted or unsubstituted alkylene, cycloalkylene, arylene, a divalent heterocyclic, carbonyloxy, thio, oxy, or amido groups, or combinations thereof. The substituted or unsubstituted alkylene groups can have 1 to 6 carbon atoms (such as methylene, 1,2-ethylene, 1,1-ethylene, n-propylene, iso-propylene, t-butylene, n-butylene, and n-hexylene groups), substituted cycloalkylene groups can have 5 to 7 carbon atoms in the cyclic ring (such as cyclopentylene and 1,4-cyclohexylene), the substituted or unsubstituted arylene groups can have 6 to 10 carbon atoms in the aromatic ring (such as 1,4-phenylene, naphthylene, 2-methyl-1,4-phenylene, and 4-chloro-1,3-phenylene groups), and the substituted or unsubstituted, aromatic or non-aromatic divalent heterocyclic groups can have 5 to 10 carbon and one or more heteroatoms (nitrogen, oxygen, or sulfur atoms) in the cyclic ring (such as pyridylene, pyrazylene, pyrimidylene, or thiazolylene groups). Combinations of two or more of these divalent linking groups can be used.

It is useful that L represent a carboxylic acid ester group such as a substituted or unsubstituted —C(=O)O-alkylene, —C(=O)O-alkylene-phenylene-, or —C(=O)O-phenylene group wherein alkylene has 1 to 4 carbon atoms. More preferably, L is a —C(=O)O-alkylene, —C(=O)O-alkylene-phenylene-, or —C(=O)O-phenylene group and most preferably, it is a —C(=O)O-alkylene group wherein the alkylene group has 1 or 2 carbon atoms.

In Structure (E) noted above, B represents recurring units derived from one or more ethylenically unsaturated polymerizable monomers that do not contain an R$^2$ group, including but not limited to, recurring units derived from a (meth)acrylate, (meth)acrylamide, vinyl ether, vinyl ester, vinyl ketone, olefin, unsaturated imide (such as maleimide), N-vinyl pyrrolidone, N-vinyl carbazole, 4-vinyl pyridine, (meth)acrylonitrile, unsaturated anhydride, or styrenic monomer. Preferably, the B recurring units are derived from one or more (meth)acrylates, styrenic monomers, (meth)acrylonitriles, (meth)acrylamides, or combinations thereof. Mixtures of monomers can be used to provide a mixture of recurring units represented by "B" in Structure (E).

In Structure (E), x is from about 20 to 85 weight %, and y is from about 15 to about 80 weight %.

Examples of useful monomers containing R$^2$ groups that are useful for these polymeric binders are the following ethylenically unsaturated polymerizable monomers A-1 through A-6:

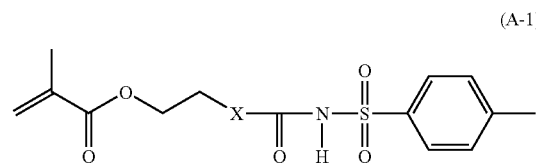

(A-1)

wherein X is as defined above,

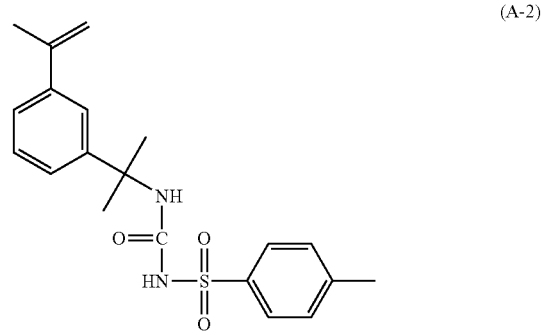

(A-2)

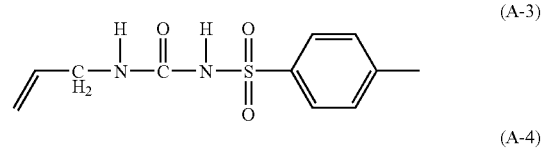

(A-3)

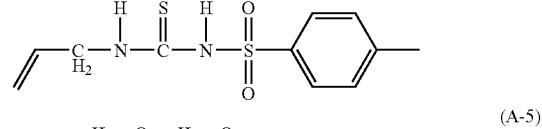

(A-4)

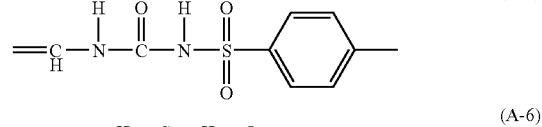

(A-5)

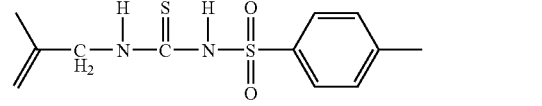

(A-6)

Further details of Class e) polymers and methods of making them are provided in U.S. Pat. No. 7,241,556 (Saraiya et al.).

Class f) Polymers:

Examples of Class f) polymers include but are not limited to, those described in U.S. Pat. No. 7,169,518 (Savariar-Hauck et al.) that also provides details about making these polymers. In particular, these polymeric binders comprise recurring units having pendant carboxy groups that are generally represented by the following Structure (I-F) or (II-F), which recurring units generally comprise at least 3 mol % of the total recurring units in the polymeric binder:

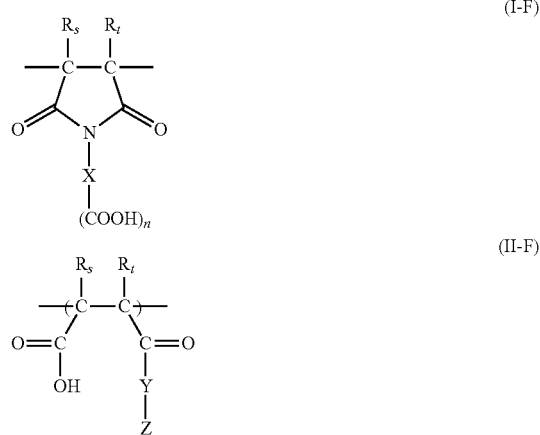

wherein n is 1 to 3 (typically 1 or 2). $R^s$ and $R_t$ are independently hydrogen or a substituted or unsubstituted alkyl group having 1 to 7 carbon atoms (such as methyl, ethyl, t-butyl, or benzyl), or a halo group (such as chloro or bromo). For example, $R^s$ and $R_t$ are independently hydrogen or a substituted or unsubstituted methyl group or chloro group.

X is a multivalent linking group including, but not limited to multivalent aliphatic and aromatic linking groups, and combinations thereof. In most embodiments, X is a divalent linking group. Such groups can include alkylene, arylene, alkylenearylene, arylenealkylene, alkyleneoxyalkylene, aryleneoxyarylene, and alkyleneoxyarylene groups, all of which can be unsubstituted or substituted with one or more substituents that do not adversely affect the performance of the second polymeric binder. For example, X is a substituted or unsubstituted phenylene group, especially when n is 1.

In Structure (II-F), Y is oxy or —NR— wherein R is hydrogen or a substituted or unsubstituted alkyl group having 1 to 10 carbon atoms (such as methyl, ethyl, iso-propyl, n-hexyl, and benzyl groups) or substituted or unsubstituted aryl group (such as a phenyl group).

Also in Structure (II-F), Z is a monovalent organic group including but not limited to, a monovalent aliphatic or aromatic group, or a combination thereof. Such groups are defined similar to the multivalent groups described above for X but can also include arylene or alkylene groups, or combinations thereof, with or without carbonyl groups [—C(=O)] or amido groups (—NH—) groups, or combinations thereof. For example, useful Z groups include —R'—NHC(=O)R" groups wherein R' is a substituted or unsubstituted alkylene group having 2 to 6 carbon atoms (such as ethylene and iso-propylene), and R" is a substituted or unsubstituted alkyl group having 1 to about 10 carbon atoms (such as methyl, methoxymethyl, ethyl, iso-propyl, n-hexyl, and benzyl groups) or a substituted or unsubstituted aryl group (such as a phenyl group). One useful Z group is a —CH$_2$CH$_2$NHC (=O)-phenyl group.

Z can also be a substituted or unsubstituted alkyl group having 1 to 10 carbon atoms (such as methyl, ethyl, iso-propyl, t-butyl, n-hexyl, and benzyl groups). Useful alkyl groups for Z include those having 1 to 8 carbon atoms (including straight-chain and branched butyl groups).

The Class f) polymeric binders generally has an acid number of at least 20 mg KOH/g and typically of from about 25 to about 45 mg KOH/g, and a number average molecular weight of at least 1,000 and up to 250,000, and typically from about 10,000 to about 150,000 as measured using known techniques.

The Class f) polymeric binders can also be represented by the following Structure (III-F):

wherein A represents recurring units defined by either Structure (I-F) or (II-F) or both Structures (I-F) and (II-F). Thus, multiple types of monomers can be used to provide the A recurring units. In Structure (III-F), x is about 3 to about 15 mol % and y is from about 85 to about 97 mol %.

B represents recurring units other than those represented by A. They can be derived from one or more ethylenically unsaturated polymerizable monomers that are capable of being co-polymerized with the monomers from which the A recurring units are derived, including maleic acid anhydride. Representative useful monomers for the B recurring units include but are not limited to, (meth)acrylates, (meth)acrylamides, vinyl ethers, vinyl esters, vinyl ketones, olefins, unsaturated imides including N-maleimides, unsaturated anhydrides such as maleic anhydrides, N-vinyl pyrrolidone, N-vinyl carbazole, 4-vinyl pyridine, (meth)acrylonitriles, or styrenic monomers, or any combinations of these monomers. Specific monomers of these and similar classes are described for example, in paragraphs [0044] through [0054] of U.S. Patent Application Publication 2004/0137366 (corresponding to EP 1,433,594A).

For example, B represents recurring units for Structure (III-F) that are derived from one or more (meth)acrylates, (meth)acrylonitriles, N-phenylmaleimide, or (meth)acrylamides such as N-alkoxyalkylmethacrylamides, or combinations of two or more of such monomers. Some useful monomers from which B recurring units are derived include methyl methacrylate, styrene, ethylenically unsaturated polymerizable monomers having pendant cyclic urea groups, and combinations thereof.

The one or more polymeric binders (of any class) can be present in the second layer at a dry coverage of from about 15 to 100 weight % and typically from about 30 to about 95 weight %.

In addition, solubility-suppressing components can be incorporated into the second layer. Such components act as dissolution inhibitors that function as solubility-suppressing components for the polymeric binders. Dissolution inhibitors typically have polar functional groups that are believed to act as acceptor sites for hydrogen bonding with various groups in the polymeric binders. The acceptor sites comprise atoms with high electron density, and can be selected from electronegative first row elements such as carbon, nitrogen, and oxygen. Dissolution inhibitors that are soluble in the alkaline developer are useful. Useful polar groups for dissolution inhibitors include but are not limited to, ether groups, amine groups, azo groups, nitro groups, ferrocenium groups, sulfoxide groups, sulfone groups, diazo groups, diazonium groups, keto groups, sulfonic acid ester groups, phosphate ester groups, triarylmethane groups, onium groups (such as sulfonium, iodonium, and phosphonium groups), groups in which a nitrogen atom is incorporated into a heterocyclic ring, and groups that contain a positively charged atom (such as quaternized ammonium group). Compounds that contain a positively-charged nitrogen atom useful as dissolution inhibitors include, for example, tetraalkyl ammonium compounds and quaternized heterocyclic compounds such as quinolinium compounds, benzothiazolium compounds, pyridinium compounds, and imidazolium compounds. Further details and representative compounds useful as dissolution inhibitors are described for example in U.S. Pat. No. 6,294,311 (noted above). Useful dissolution inhibitors include triarylmethane dyes such as ethyl violet, crystal violet, malachite green, brilliant green, Victoria blue B, Victoria blue R, and Victoria pure blue BO, BASONYL® Violet 610 and D11 (PCAS, Longjumeau, France).

The second layer generally also includes colorants. Useful colorants are described for example in U.S. Pat. No. 6,294,311 (noted above) including triarylmethane dyes such as ethyl violet, crystal violet, malachite green, brilliant green, Victoria blue B, Victoria blue R, and Victoria pure blue BO. These compounds can act as contrast dyes that distinguish the non-exposed regions from the exposed regions in the developed imageable element.

The second layer can optionally also include contrast dyes, printout dyes, coating surfactants, dispersing aids, humectants, biocides, viscosity builders, drying agents, defoamers, pH adjusters, preservatives, antioxidants, rheology modifiers, development aids, or combinations thereof, in known amounts. Generally, the second layer is not crosslinked.

The second layer can also comprise an adhesion promoting compound that promotes adhesion between the second layer and the silicone rubber layer (described below). The adhesion promoting compound generally comprises one or more vinyl, SiH, SiOH, $SiOR_3$, $SiOCOR_4$, or epoxy groups wherein $R_3$ and $R_4$ are independently substituted or unsubstituted alkyl or aryl groups wherein the alkyl groups can have 1 to 20 carbon atoms and the aryl groups are generally phenyl or naphthyl groups.

The second layer generally has a dry coating coverage of from about 0.5 to about 3.5 $g/m^2$ and typically from about 0.4 to about 2 $g/m^2$.

Intermediate drying steps may be used between applications of the various layer formulations to remove solvent(s) before coating other formulations. Drying steps may also help in preventing the mixing of the various layers.

There may be a separate layer that is between and in contact with the first and second layers. This separate layer can act as a barrier to minimize migration of radiation absorbing compound(s) from the first layer to the second layer. This separate "barrier" layer generally comprises a third polymeric binder. If this third polymeric binder is different from the first polymeric binder(s) in the first layer, it is typically soluble in at least one organic solvent in which the first layer first polymeric binders are insoluble. A useful third polymeric binder is a poly(vinyl alcohol). Generally, this barrier layer should be less than one-fifth as thick as the first layer, and typically less than one-tenth as thick as the first layer.

Useful examples of already coated first and second layers onto which the crosslinked silicone rubber layer can be disposed are commercially available KODAK SWORD™, SWORD EXCEL™, and SWORD ULTRA™ printing plate precursors that can be obtained from Eastman Kodak Company (Rochester, N.Y.). Some specific details of such printing plate precursors and the first and second layer composition are provided, for example, in U.S. Pat. No. 6,843,176 (Ray et al.) and U.S. Pat. No. 7,723,689 (Wieland et al.) both of which are incorporated herein by reference with respect to their teaching concerning such precursors.

Crosslinked Silicone Rubber Layer:

The crosslinked silicone rubber layer disposed on the second layer is an ink repellant layer that may be formed from either an addition type silicone rubber or a condensation type silicone rubber.

Generally, the silicone rubber is a crosslinked silicone rubber that is derived from either Composition I or Composition TI defined as follows:

Composition I:

a) a polysiloxane material having predominantly dimethylsiloxane units and siloxane units represented by the following Structure (PSR):

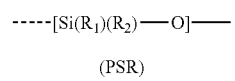

(PSR)

wherein $R_1$ and $R_2$ are independently alkyl, aryl, and alkenyl groups as long as at least one is an alkenyl group, b) a silane crosslinking agent having SiH groups, c) a platinum catalyst, and d) optionally a stabilizer, or adhesion promoter, or both.

For the component a) noted above, the alkyl groups for $R_1$ and $R_2$ can be the same or different and can be substituted or unsubstituted and have from 1 to 50 carbon atoms. Similarly, the alkenyl groups can be the same or different and can also be substituted or unsubstituted and have 2 to 50 carbon atoms. The aryl groups can be the same or different and can be substituted or unsubstituted and have 6, 10, or 14 carbon atoms in the carbocyclic ring.

It may be useful for at least 50% of the $R_1$ and $R_2$ groups to be methyl groups to promote ink repellency. The resulting polysiloxane material having the units defined by Structure (PSR) may have a molecular weight of from about 5,000 to about 5,000,000 or typically from about 50,000 to about 2,500,000. The amount of polysiloxane material in Composition I is generally at least 60% and up to 99%, and typically from about 70 to about 99%, based on total solid weight.

Representative examples of polysiloxane materials having an SiH group [component b)] in the molecular chain or at a terminal thereof are illustrated by the following Structures (PSR-I), (PSR-II), (PSR-III), (PSR-IV), and (PSR-V) that are not to be interpreted as the only possible structures of polysiloxane materials:

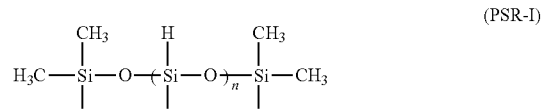

(PSR-I)

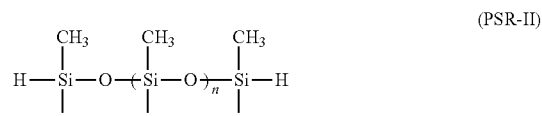

(PSR-II)

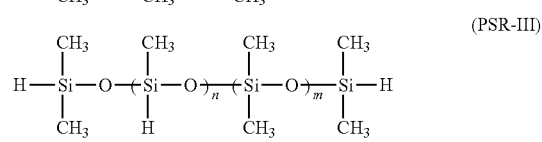

(PSR-III)

-continued

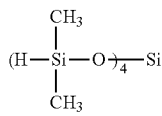
(PSR-IV)

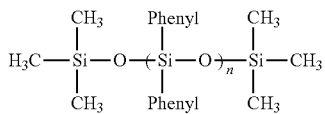
(PSR-V)

wherein "n" in each Structure is an integer greater than 1, and "m" is an integer greater than 0.

The amount of SiH groups in the SiH group-containing polysiloxane material is at least 2 in number and usually more than 3 in number. The amount of the polysiloxane material in Composition I is generally at least 0.1 and up to 20%, and typically from about 1 to about 15%, based on total solids. The quantity ratio of polysiloxane material to polydimethylsiloxane can be generally in the range of from about 1.5 to about 30 and typically from about 10 to 20.

Catalysts that are useful as component c) in Composition I are platinum compounds that include but are not limited to platinum, platinum chloride, chloroplatinic acid, olefin coordinated platinum, alcohol modified complex of platinum, and a methylvinyl polysiloxane complex of platinum. The catalyst may be present in the curable Composition I in an amount generally of from about 0.01 to about 20% or typically from about 0.1 to 10%, based on the total composition solids (or dry silicone rubber layer). The amount of platinum in the cured layer is generally from about 10 to about 1000 ppm and typically from about 100 to about 500 ppm.

Optional stabilizers that can be present in Composition I as component d) include but are not limited to, nitrogen-containing compounds, phosphorus-containing compounds, and unsaturated alcohols such as acetylene-containing alcohols. Such compounds can be present in an amount of from about 0.01 to about 10%, and typically from about 0.1 to about 5%, based on total solids in Composition I.

Optional adhesion promoters for Composition I include hydroxy-containing organopolysiloxanes or hydrolyzable functional group-containing silane or siloxanes. Composition may also include a filler such as silica or a silane coupling agent, a titanate-based coupling agent, or an aluminum-based coupling agent. Useful silane coupling agents include but are not limited to, alkoxysilanes, acetoxysilanes, ketoximinesilanes, and vinyl-containing coupling agents.

Composition II:

a) a polydimethylsiloxane having SiOH, $SiOR_3$, or $SiOCOR_4$ terminal groups, or any combination thereof, wherein $R_3$ and $R_4$ are independently substituted or unsubstituted alkyl, aryl, or alkenyl groups, b) a siloxane crosslinking agent having at least two of any of the SiOH, $SiOR_3$, or $SiOCOR_4$ groups, wherein $R_3$ and $R_4$ are as defined above, and c) optionally a catalyst, adhesion promoter, or both.

Component a) of Composition II can be a hydroxy-containing polydimethylsiloxane that is represented by the Structure (PSR) as defined above but in addition, the compounds have SiOH, $SiOR_3$, or $SiOCOR_4$ groups positioned at molecular terminals wherein $R_3$ and $R_4$ are the same or different and can be substituted or unsubstituted alkyl groups and have from 1 to 50 carbon atoms, the same or different substituted or unsubstituted alkenyl groups that can also be substituted or unsubstituted and have 2 to 50 carbon atoms, or the same or different substituted or unsubstituted aryl groups having 6, 10, or 14 carbon atoms in the carbocyclic rings.

The resulting polydimethylsiloxane with the noted terminal groups may have a molecular weight of from about 10,000 to about 600,000 or typically from about 30,000 to about 200,000. The amount of polysiloxane material in Composition II is generally at least 60% and up to 99%, and typically from about 70 to about 99%, based on total solid weight.

Siloxane crosslinking agents useful in Composition II include but are not limited to, acetoxysilanes, alkoxysilanes, ketoximinesilanes, allyloxysilanes and others known in the art that can be represented by the following Structure (SILANE):

(SILANE)

wherein p is an integer of 2 to 4 (typically 3 or 4), and $R_6$ represents a substituted or unsubstituted alkyl group having 1 to 50 carbon atoms, a substituted or unsubstituted alkenyl group having 2 to 50 carbon atoms, a substituted or unsubstituted aryl group having 6, 10, or 14 carbon atoms in the aromatic ring, or a group formed by combining two or more of the alkyl, alkenyl, and aryl groups. X represents a functional group selected from halogen atoms, alkoxy groups, acyloxy groups, ketoximine groups, aminoxy groups, amido groups, and alkenyloxy groups.

Examples of siloxane crosslinking agents [component b) of Composition II] include but are not limited to, methyltriacetoxysilane, ethyltriacetoxysilane, vinyl triacetoxysilane, methyltrimethoxysilane, methyltriethoxysilane, ethyltrimethoxysilane, ethyltriethoxysilane, tetraethoxysilane, tetrapropoxysilane, vinyl trimethoxysilane, vinyl triphenoxysilane, vinyl triethoxysilane, allyltriethoxysilane, vinyl triisopropoxysilane, vinyl triisopropenoxysilane, vinyl methylbis(methylethylketoximine)silane, methyltri(methylethylketoximine)silane, vinyltri(methylethylketoximine)silane, tetra(methylethylketoximine)silane, diisopropenoxydimethylsilane, triisopropenoxymethylsilane, and triallyloxysilane. The acetoxysilanes and ketoximinesilanes are particularly useful.

The amount of siloxane crosslinking agents present in Composition II is generally at least 1.5% and up to 20%, and typically from about 3% to about 10%, based on total composition solids. The ratio of siloxane crosslinking agent to the polydimethylsiloxane in Composition II is such that the molar ratio of functional groups "X" of the crosslinking agent to the hydroxy groups in the polydimethylsiloxane is generally from about 1.5 to about 10.

Optional catalysts for component c) of Composition II include but are not limited to, acids such as organic carboxylic acids including acetic acid, propionic acid, and maleic acid, toluenesulfonic acid, boric acid, and others readily apparent to one skilled in the art, alkalis such as potassium hydroxide, sodium hydroxide, and lithium hydroxide, amines, metal alkoxides such as titanium tetrapropoxide and titanium tetrabutoxide, metal diketenates such as iron acetylacetonate and titaniumacetylacetonatedipropoxide, and organic acid salts of metals such as acid salts of tin, lead, zinc, iron, cobalt, calcium, and manganese. Specific useful catalysts are dibutyltin diacetate, dibutyltin dioctate, dibutyltin dilaurate, zinc octylate, and iron octylate. The catalysts may be present in Composition II in an amount of from about 0.01 to about 20% and typically from about 0.1 to about 10%, based on total solids.

Adhesion promoters that may be present in Composition II include but are not limited to, those described above for Composition I in similar amounts. In addition, fillers such as silicas may be present in Composition II.

The crosslinked silicone rubber layer has a dry thickness of from about 0.5 to about 3.5 μm that generally corresponds to a dry coverage of from about 0.5 to about 3.5 g/m$^2$ and typically from about 1 to about 3 g/m$^2$ to provide desired ink repellency, scratch resistance, and printing durability.

Preparation of Imageable Elements

The multi-layer imageable element can be prepared by sequentially applying an first layer formulation over the surface of the substrate (and any other adhesive layers provided thereon), applying a second layer formulation over the first layer using conventional coating or lamination methods, and then applying a silicone rubber composition over the second layer.

For example, the first and second layers can be applied by dispersing or dissolving the desired ingredients in a suitable coating solvent(s), and the resulting formulations are sequentially or simultaneously applied to the substrate using suitable equipment and procedures, such as spin coating, knife coating, gravure coating, die coating, slot coating, bar coating, wire rod coating, roller coating, or extrusion hopper coating. The formulations can also be applied by spraying onto a suitable support (such as an on-press printing cylinder).

The selection of solvents used to coat both the first and second layers depends upon the nature of the first and second polymeric binders, other polymeric materials, and other components in the formulations. To prevent the first and second layer formulations from mixing or the first layer from dissolving when the second layer formulation is applied, the second layer formulation should be coated from a solvent in which the first polymeric binder(s) of the first layer are insoluble.

Generally, the first layer formulation is coated out of a solvent mixture of methyl ethyl ketone (MEK), 1-methoxy-2-propyl acetate (PMA), γ-butyrolactone (BLO), and water, a mixture of MEK, BLO, water, and 1-methoxypropan-2-ol (also known as Dowanol® PM or PGME), a mixture of diethyl ketone (DEK), water, methyl lactate, and BLO, a mixture of DEK, water, and methyl lactate, or a mixture of methyl lactate, methanol, and dioxolane.

The second layer formulation can be coated out of solvents or solvent mixtures that do not dissolve the first layer. Typical solvents for this purpose include but are not limited to, butyl acetate, iso-butyl acetate, methyl iso-butyl ketone, DEK, 1-methoxy-2-propyl acetate (PMA), iso-propyl alcohol, PGME and mixtures thereof. Particularly useful is a mixture of DEK and poly(ethylene glycol) methyl ether methacrylate (PGMEA), or a mixture of DEK, PMA, and isopropyl alcohol.

Alternatively, the first and second layers may be applied by extrusion coating methods from melt mixtures of the respective layer compositions. Typically, such melt mixtures contain no volatile organic solvents.

Intermediate drying steps may be used between applications of the various layer formulations to remove solvent(s) before coating other formulations. Drying steps may also help in preventing the mixing of the various layers.

The silicone rubber layer Composition I or II can then be applied over the second layer in any suitable fashion (for example, lamination) and heat-treated at 50 to 200° C. for up to 4 minutes to effect curing or crosslinking.

A protective layer may be disposed on the silicone rubber layer. Such protective layers can be polyester, polypropylene, polyvinyl alcohol, ethylene-vinyl acetate copolymer saponified, or polyvinylidene chloride films. The protective layer or film can be formed or laminated to the silicone rubber layer using known procedures. The layer can be from about 10 to about 100 μm in dry thickness. The protective layer is generally peeled off or otherwise removed before or after imaging and before development and printing.

Imaging and Development

The imageable elements can have any useful form including, but not limited to, printing plate precursors, printing cylinders, printing sleeves (solid or hollow cores) and printing tapes (including flexible printing webs). For example, the imageable members can be printing plate precursors useful for providing lithographic printing plates.

Printing plate precursors can be of any size or shape (for example, square or rectangular) having the requisite first and second layers and crosslinked silicone rubber layer disposed on a suitable substrate. Printing cylinders and sleeves are known as rotary printing members having a substrate and the requisite layer in cylindrical form. Hollow or solid metal cores can be used as substrates for printing sleeves.

During use, the imageable elements are exposed to a suitable source of infrared radiation at a wavelength of from about 700 to about 1500 nm and typically from about 700 to about 1200 nm. The lasers used to expose the imageable elements are usually diode lasers, because of the reliability and low maintenance of diode laser systems, but other lasers such as gas or solid-state lasers may also be used. The combination of power, intensity and exposure time for laser imaging would be readily apparent to one skilled in the art. Presently, high performance lasers or laser diodes used in commercially available imagesetters emit infrared radiation at a wavelength of from about 800 to about 850 nm or from about 1040 to about 1120 nm.

The imaging apparatus can function solely as a platesetter or it can be incorporated directly into a lithographic printing press. In the latter case, printing may commence immediately after imaging, thereby reducing press set-up time considerably. The imaging apparatus can be configured as a flatbed recorder or as a drum recorder, with the imageable member mounted to the interior or exterior cylindrical surface of the drum. Examples of useful imaging apparatus are available as models of Kodak Trendsetter imagesetters available from Eastman Kodak Company (Burnaby, British Columbia, Canada) that contain laser diodes that emit near infrared radiation at a wavelength of about 830 nm. Other suitable imaging sources include the Crescent 42T Platesetter that operates at a wavelength of 1064 nm and the Screen PlateRite 4300 series or 8600 series platesetter (available from Screen, Chicago, Ill.). Additional useful sources of radiation include direct imaging presses that can be used to image an element while it is attached to the printing plate cylinder. An example of a suitable direct imaging printing press includes the Heidelberg SM74-DI and QMDI presses (available from Heidelberg, Dayton, Ohio).

Imaging speeds may be in the range of from about 75 to about 300 mJ/cm$^2$, and typically from about 110 to about 170 mJ/cm$^2$. For example, imaging in the method of this invention should be carried out at an energy such that no more than 30 weight % of the first and second layers is removed by ablation.

While laser imaging is useful in the practice of this invention, imaging can be provided by any other means that provides thermal energy in an imagewise fashion. For example, imaging can be accomplished using a thermoresistive head (thermal printing head) in what is known as "thermal printing", as described for example in U.S. Pat. No. 5,488,025 (Martin et al.) and as used in thermal fax machines and sublimation printers. Thermal print heads are commercially available (for example, as a Fujitsu Thermal Head FTP-040 MCS001 and TDK Thermal Head F415 HH7-1089).

Direct digital imaging is generally used for imaging. The image signals are stored as a bitmap data file on a computer. Raster image processor (RIP) or other suitable means may be used to generate such files. The bitmaps are constructed to define the hue of the color as well as screen frequencies and angles.

Imaging of the imageable element produces an imaged element that comprises a latent image of imaged (exposed) and non-imaged (non-exposed) regions. Developing the imaged element with a suitable aqueous solution (described below) removes predominantly only the crosslinked silicone rubber layer and either or both the first and second layers in the exposed regions. The exposed (or imaged) regions are ink-accepting while the non-exposed (or non-imaged) regions of the crosslinked silicone rubber layer are ink-repelling. Development with a suitable aqueous solution can be carried out in one or two steps using the same or different aqueous solutions, and either step can be accompanied by use of mechanical removal means as described below.

Several embodiments of the present invention can be described as follows:

In one embodiment, imaging is carried out with infrared radiation and followed by development with water or an aqueous solution having less than 8 weight % organic solvents (for example, consisting essentially of a surfactant), and mechanical removal means such as brushing, to remove imaged regions of the silicone rubber layer and the second layer. Imaging promotes deformation in the second layer and it can be removed along with the overlying crosslinked silicone rubber layer. The first layer in the imaged regions is left on the printing plate and accepts ink during printing while the non-imaged regions of the crosslinked silicone rubber layer repels ink. While the substrate does not need to be treated to accept or repel ink, it can be treated in a suitable manner (described above) to promote adhesion to the first layer that remains after imaging and development.

In another embodiment, imaging is carried out with infrared radiation and followed by a first development step using water and mechanical removal means such as brushing that is followed with a second development step using an alkaline developer to remove imaged regions of the crosslinked silicone rubber layer and both the first and second layers. The first step removes the crosslinked silicone rubber layer and allows the alkaline developer to penetrate and remove the first and second layers. The revealed substrate (for example, aluminum) accepts ink during printing while the non-imaged regions of the crosslinked silicone rubber layer repels ink. The substrate is purposely not treated to be hydrophilic since it needs to be more oleophilic than the crosslinked silicone rubber layer.

In still another embodiment, imaging is carried out with infrared radiation and the imaged regions of the crosslinked silicone rubber layer and the second layer are removed by mechanical brushing, with or without vacuum. No developing solutions are used, and as in the first embodiment noted above, the first layer remains to accept ink during printing.

Mechanical means for removing one or more layers during development include various wiping means (such as a rag, sponge, or cloth) or soft brushes.

In embodiments in which an alkaline developer is used, such developers can be any of those commonly used in the art for processing positive-working lithographic printing plate precursors including but not limited to, aqueous alkaline developers that generally have a pH of from about 8 to about 14 and more typically of at least 12, or of at least 13. Useful alkaline aqueous developers include 3000 Developer, 9000 Developer, GoldStar™ Developer, Goldstar™ Plus Developer, GoldStar™ Premium, GREENSTAR Developer, ThermalPro Developer, PROTHERM Developer, MX1813 Developer, and MX1710 Developer (all available from Eastman Kodak Company), as well as Fuji HDP7 Developer (Fuji Photo) and Energy CTP Developer (Agfa). These compositions generally include surfactants, chelating agents (such as salts of ethylenediaminetetraacetic acid), and alkaline components (such as inorganic metasilicates, organic metasilicates, hydroxides, and bicarbonates). Such developers are essentially free of organic solvents (less than 8 weight %).

Other developers that are known in the art as containing organic solvents may be used in the practice of this invention but they are not preferred and can be avoided if desired to provide a further advantage of not having to dispose of the organic solvent-containing solutions. Such developers generally have a lower pH (for example, below 12) and are generally single-phase solutions of one or more organic solvents that are miscible with water, such as 2-ethylethanol and 2-butoxyethanol. Representative solvent-containing alkaline developers include ND-1 Developer, 955 Developer, 956 Developer, 989 Developer, and 980 Developer (all available from Eastman Kodak Company), HDN-1 Developer (available from Fuji), and EN 232 Developer (available from Agfa).

If aqueous solutions containing one or more surfactants (and less than 8 weight % organic solvents) are used for development, they generally have a pH greater than 6 and up to about 12. The surfactants can be anionic and include those with carboxylic acid, sulfonic acid, or phosphonic acid groups (or salts thereof). Anionic surfactants having sulfonic acid (or salts thereof) groups are particularly useful. For example, anionic surfactants can include aliphates, abietates, hydroxyalkanesulfonates, alkanesulfonates, dialkylsulfosuccinates, alkyldiphenyloxide disulfonates, straight-chain alkylbenzenesulfonates, branched alkylbenzenesulfonates, alkylnaphthalenesulfonates, alkylphenoxypolyoxyethylenepropylsulfonates, salts of polyoxyethylene alkylsulfonophenyl ethers, sodium N-methyl-N-oleyltaurates, monoamide disodium N-alkylsulfosuccinates, petroleum sulfonates, sulfated castor oil, sulfated tallow oil, salts of sulfuric esters of aliphate alkylester, salts of alkylsulfuric esters, sulfuric esters of polyoxy-ethylene alkylethers, salts of sulfuric esters of aliphatic monoglucerides, salts of sulfuric esters of polyoxyethylenealkylphenylethers, salts of sulfuric esters of polyoxyethylenestyrylphenylethers, salts of alkylphosphoric esters, salts of phosphoric esters of polyoxyethylenealkylethers, salts of phosphoric esters of polyoxyethylenealkylphenylethers, partially saponified compounds of styrene-maleic anhydride copolymers, partially saponified compounds of olefin-maleic anhydride copolymers, and naphthalenesulfonateformalin condensates. Alkyldiphenyloxide disulfonates (such as sodium dodecyl phenoxy benzene disulfonates), alkylated naphthalene sulfonic acids, sulfonated alkyl diphenyl oxides, and methylene dinaphthalene sulfonic acids) are particularly useful as the primary or "first" anionic surfactant. Such surfactants can be obtained from various suppliers as described in McCutcheon's Emulsifiers & Detergents, 2007 Edition.

Particular examples of such surfactants include but are not limited to, sodium dodecylphenoxyoxybenzene disulfonate, the sodium salt of alkylated naphthalenesulfonate, disodium methylene-dinaphthalene disulfonate, sodium dodecylbenzenesulfonate, sulfonated alkyl-diphenyloxide, ammonium or potassium perfluoroalkylsulfonate and sodium dioctylsulfosuccinate.

The one or more anionic surfactants are generally present in an amount of at least 1 weight %, and typically from about 1 to about 45 weight %, or from about 1 to about 30 weight % (based on the weight of the solution).

The aqueous solutions may also include nonionic surfactants as described in [0029] or hydrophilic polymers described in [0024] of EP 1,751,625 (noted above), incorporated herein by reference. Particularly useful nonionic surfactants include Mazol® PGO31-K (a triglycerol monooleate, Tween® 80 (a sorbitan derivative), Pluronic® L62LF (a block copolymer of propylene oxide and ethylene oxide), and Zonyl FSN (a fluorocarbon). These nonionic surfactants can be present in an amount of up to 10 weight %, but at usually less than 2 weight %.

Other optional components of the aqueous solution used for development include inorganic salts (such as those described in [0032] of U.S. Patent Application 2005/0266349, noted above), wetting agents (such as a glycol), a metal chelating agents, antiseptic agents, anti-foaming agents, ink receptivity agents (such as those described in [0038] of U.S. Pat. No. '349), and viscosity increasing agents as noted above. The amounts of such components are known in the art. Metal ion chelating agents are particularly useful, including but not limited to, polyaminopolycarboxylic acids, aminopolycarboxylic acids, or salts thereof, [such as salts of ethylenediaminetetraacetic acid (EDTA, sodium salt)], organic phosphonic acids and salts thereof, and phosphonoalkanetricarboxylic acids and salts thereof. Organic amines may also be useful.

Generally, the developing solution (for example water) is applied to the imaged element by rubbing, spraying, jetting, dipping, coating, or wiping it with the aqueous solution or a roller, impregnated pad, or applicator containing the aqueous solution. For example, the imaged element can be brushed with the aqueous solution, or the aqueous solution may be poured on or applied by spraying the second layer with sufficient force to remove the exposed regions using a spray nozzle system as described for example in [0124] of EP 1,788,431A2 (noted above). Still again, the imaged element can be immersed in the aqueous solution and rubbed by hand or with a mechanical wiping means.

The aqueous solution can also be applied in a unit or station that has at least one roller for rubbing or brushing the imaged element while the aqueous solution is applied during development. The aqueous solution can be collected in a tank and used several times, and replenished if necessary from a reservoir of aqueous solution. A replenisher can be of the same concentration as the solution used in development, or be provided in concentrated form and diluted with water at an appropriate time.

Following development, the imaged element can be dried in a suitable fashion. The imaged and developed element can be used for printing by contacting it on-press with only a lithographic printing ink (absent a fountain solution). Lithographic ink alone (no fountain solution) can be applied to the printing surface of the imaged element for printing. The non-exposed regions of the crosslinked silicone rubber layer repel ink and the exposed regions (either substrate or first layer) revealed by the imaging and development process accepts the ink. The ink is then transferred to a suitable receiving material (such as cloth, paper, metal, glass, or plastic) to provide a desired impression of the image thereon. If desired, an intermediate "blanket" roller can be used to transfer the ink from the imaged member to the receiving material. The imaged members can be cleaned between impressions, if desired, using conventional cleaning means and chemicals.

The following examples are presented to illustrate the practice of this invention but are not intended to be limiting in any manner.

EXAMPLES

Materials and Methods

Byk® 307 is a polyethoxylated dimethylpolysiloxane copolymer that is available from Byk Chemie (Wallingford, Conn.) in a 25 wt. % xylene/-methoxypropyl acetate solution.

BLO represents γ-butyrolactone.

Copolymer A represents a copolymer having recurring units derived from N-phenyl maleimide, methacrylamide, and methacrylic acid (45:35:20 mol %) using conventional conditions and procedures.

DEK represents diethyl ketone.

Dow Syloff 297 is an acetoxy and epoxy functional silsesquioxane that is available from Dow Corning, Michigan, USA.

Ethyl violet is assigned C.I. 42600 (CAS 2390-59-2, $\lambda_{max}$=596 nm) and has the formula of p-$(CH_3CH_2)_2NC_6H_4)_3$ C+Cl-.

Intermediate A was prepared by charging dimethylacetamide (246.6 g), HEMA, 2-hydroxy ethyl methacrylate (65 g), and dibutyl tin dilaurate (0.42 g) into a 500 ml, 4-neck ground glass flask, equipped with a heating mantle, temperature controller, mechanical stirrer, condenser, pressure equalized addition funnel and nitrogen inlet. The reaction mixture was heated to 60° C. under nitrogen atmosphere. Then, p-toluene sulfonyl isocyanate (98.6 g) was added at 60° C. over a period of one hour. The reaction was completed in six hours as determined by the disappearance of isocyanate infrared absorption band at 2275 cm$^{-1}$. At the end of the reaction, methanol (5 g) was added. The resulting intermediate had an acid number of 163.6 and was used to prepare Copolymer C.

IR Dye A is an infrared absorbing dye supplied by Eastman Kodak of Rochester, N.Y. and has the following structure:

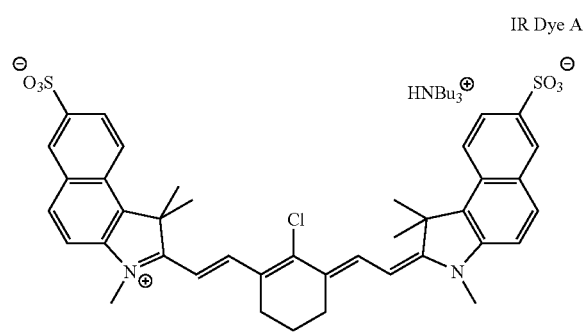

IR Dye A

P3000 represents the reaction product of 1,2-naphthaquinone-5-sulfonyl chloride with pyrogallol acetone condensate (PCAS, Longjumeau, France).

PGME represents 1-methoxypropan-2-ol (available as Dowanol® PM).

PGMEA represents poly(ethylene glycol) methyl ether methacrylate (50% water) that was obtained from Aldrich Chemical Company (Milwaukee, Wis.).

SD140A is novolac resin, 75% m-cresol, 25% p-cresol, MW of 7000 (Borden Chemical, Louisville, Ky.).

Substrate A is a 0.3 mm gauge aluminum sheet that had been electrogramed, anodized, and treated with poly(vinyl phosphonic acid).

| First Layer Formulation: | |
|---|---|
| Copolymer A | 85 parts |
| IR Dye A | 15 parts |
| Solvent: (BLO/MEK/water/PGME 15/20/5/60 wt %) | |
| Second Layer Formulation: | |
| P3000 | 50 parts |
| SD140A | 49.15 parts |
| Ethyl violet | 0.5 g |
| Byk ® 307 (10% solution in DEK) | 0.35 g |
| Solvent: (DEK) | |
| Silicone Rubber Layer Formulation: | |
| Wacker Dehesive ® 944 silicone | 74.2 parts |
| Wacker V24 crosslinking agent | 1.50 parts |
| Wacker Catalyst OL catalyst | 4.11 parts |
| Dow Syloff 297 | 20.1 parts |

Invention Example 1

A three-layer lithographic printing plate precursor was prepared by applying the First Layer Formulation to Substrate A using a 0.012 inch (0.030 cm) wire-wound bar and dried for 90 seconds at 100° C. to provide a dry coating weight of approximately 2 g/m². The Second Layer Formulation was then applied over the dried first layer using a 0.006 inch (0.030 cm) wire-wound bar and dried for 90 seconds at 100° C. to provide a dry coat weight of approximately 0.7 g/m². These two layer formulations are used in the commercially available Kodak SWORD lithographic printing plate precursors.

The silicone rubber layer formulation was then applied to the dried second layer to provide a dry silicone rubber thickness of about 1.9 μm after curing at 140° C. for about 4 minutes.

Samples of the resulting non-ablative negative-working imageable element were imaged using a Kodak CTP Thermal Head at various imaging energies from 70 mJ/cm² to 250 mJ/cm² at 20 mJ/cm² increments. The imaging file included 0-100% tints and 1 to 4 pixels. The imaged elements were then developed by wiping them with water to remove the silicone rubber layer in the non-exposed regions, and the resulting printing plates were then inked and used for printing. From the printed impressions, it was apparent that 110 mJ/cm² was not sufficient energy for imaging the elements but 130 mJ/cm² was. All tints were printed at that energy (2-100% 200 lpi). The plates were used for printing 70,000 impressions.

Invention Examples 2 and 3

The imageable element described in Invention Example 1 was imaged as described therein but processed using either an aqueous solution of Tween 80 nonionic surfactant (1 weight %) for Example 2, or an aqueous solution of Zonyl® FTS nonionic surfactant (1 weight %) for Example 3. In both instances, a suitable image was obtained that was then used for acceptable waterless printing (1-100% tints 200 lpi).

The invention has been described in detail with particular reference to certain preferred embodiments thereof, but it will be understood that variations and modifications can be effected within the spirit and scope of the invention.

The invention claimed is:

1. A non-ablative imageable element comprising a substrate having thereon, in order:

a first layer comprising a first polymeric binder and an infrared radiation absorbing compound, a second layer comprising a second polymeric binder and comprises less than 3 weight % of infrared radiation absorbing compound, and a crosslinked silicone rubber layer disposed over said second layer, wherein said second polymeric binder is selected from the group consisting of the following groups of polymer materials:

Class a): novolak resins, resole resins, branched or unbranched polyhydroxystyrenes, polyvinyl acetals with pendant phenol groups, or any combination thereof, Class b): polymers having recurring units derived from one or more monomers of group (a) that is selected from the group consisting of norbornene, tetracyclododecene, and mixtures thereof, and recurring units derived from one or more monomers of group (b) that is selected from the group consisting of maleic anhydride, maleimide, N-phenyl maleimide, N-benzyl maleimide, N-cyclohexyl maleimide, and mixtures thereof, Class c): copolymers derived from maleic anhydride and monomers of the formula $CH_2=CH(C_6H_4R^1)$ and mixtures thereof in which $R^1$ is hydrogen, halogen, hydroxyl, cyano, sulfonamide, alkyl of 1 to 6 carbon atoms, alkoxyl of 1 to 6 carbon atoms, acyl of 1 to 7 carbon atoms, acyloxy of 1 to 7 carbon atoms, carboalkoxy of 1 to 7 carbon atoms, or a mixture thereof, Class d): copolymers derived from methyl methacrylate and a carboxylic acid containing monomer or a mixture of carboxylic acid containing monomers, Class e): polymers having an —X—C(=T)-NR—S(=O)$_2$— moiety that is attached to the polymer backbone, wherein —X— is an oxy or —NR'— group, T is O or S, R and R' are independently hydrogen, halo, or an alkyl group having 1 to 6 carbon atoms, and Class f): polymers having recurring units represented by the following Structure (I-F) or (II-F):

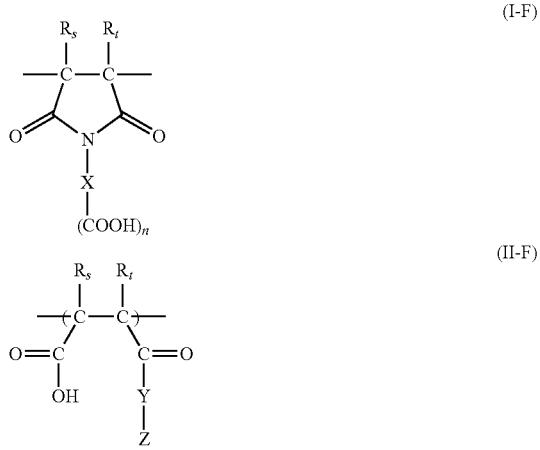

wherein n is 1 to 3, $R_s$ and $R_t$ are independently hydrogen or an alkyl or halo group, X is a multivalent linking group, Y is oxy or —NR— wherein R is hydrogen or an alkyl or aryl group, and Z is a monovalent organic group, wherein said first polymeric binder is present in said first layer in an amount of at least 60 weight % and said first layer has a dry coverage of from about 0.7 to about 3 g/m², said second polymer binder is present in said second layer in an amount of at least 50 weight % and said second layer has a dry coverage of from about 0.3 to about 2 g/m² and said crosslinked silicone rubber layer has a dry thickness of from about 0.5 to about 3.5 µm.

2. The element of claim 1 wherein the glass transition temperature ($T_g$) of said first polymeric binder is higher than the glass transition temperature ($T_g$) of said second polymeric binder by at least 10° C.

3. The element of claim 1 wherein said first layer has chemical resistance such that the loss in dry coating weight is less than 35% as demonstrated by soaking said dried first layer alone on an aluminum substrate for five minutes in a 2-butoxyethanol:water 80:20 weight solution at room temperature.

4. The element of claim 1 wherein said first polymeric binder is derived at least in part from a (meth)acrylonitrile and an N-substituted cyclic imide, and optionally in addition from a (meth)acrylamide.

5. The element of claim 1 wherein said infrared radiation absorbing compound is an IR absorbing dye that is present only in said first layer in an amount of at least 5 weight %.

6. The element of claim 1 wherein said crosslinked silicone rubber layer is derived from either Composition I or Composition II defined as follows:
Composition I that comprises:
a) a polysiloxane material having predominantly dimethylsiloxane units and siloxane units represented by the following Structure (PSR):

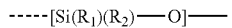

(PSR)

wherein $R_1$ and $R_2$ are independently alkyl, aryl, and alkenyl groups as long as at least one is an alkenyl group,
b) a silane crosslinking agent having SiH groups,
c) a platinum catalyst, and
d) optionally a stabilizer, or adhesion promoter, or both,
Composition II that comprises:
a) a polydimethylsiloxane having SiOH, $SiOR_3$, or $SiOCOR_4$ terminal groups, or any combination thereof, wherein $R_3$ and $R_4$ are independently substituted or unsubstituted alkyl, aryl, or alkenyl groups,
b) a siloxane crosslinking agent having at least two of any of the SiOH, $SiOR_3$, or $SiOCOR_4$ groups, wherein $R_3$ and $R_4$ are as defined above, and
c) optionally a catalyst, adhesion promoter, or both.

7. The element of claim 1 that is a lithographic printing plate precursor having an aluminum-containing substrate.

8. The element of claim 1 wherein:
a) said substrate has a different color tone than the combined color tone of said first and second layers,
b) said first and second layers have different color tones, or
c) both said substrate has a different color tone than the combined color tone of said first and second layers, and said first and second layers have different color tones.

9. The element of claim 1 wherein said second layer comprises an adhesion promoting compound that promotes adhesion between said second layer and said crosslinked silicone rubber layer, and said adhesion promoting compound comprises one or more vinyl, SiH, SiOH, $SiOR_3$, $SiOCOR_4$, or epoxy groups wherein $R_3$ and $R_4$ are independently substituted or unsubstituted alkyl or aryl groups.

10. The element of claim 1 further comprising a protective layer disposed on said crosslinked silicone rubber layer.

11. A method of making an imaged element suitable for waterless printing, said method comprising, without ablation:
A) imagewise exposing the imageable element of claim 1 using infrared radiation to provide both exposed and non-exposed regions in said imageable element, and
B) removing the crosslinked silicone rubber layer and second layer in predominantly only said exposed regions to provide an imaged element.

12. The method of claim 11 wherein said crosslinked silicone rubber layer and second layer are removed in said exposed regions by:
a) contacting said imagewise exposed imageable element with water or an aqueous solution comprising less than 8 weight % organic solvents,
b) by applying mechanical removal means, or
c) both by contacting said element with water or an aqueous solution comprising less than 8 weight % organic solvents and applying mechanical removal means.

13. The method of claim 11 wherein said first layer of said imagewise exposed imageable element is not removed during step B.

14. The method of claim 11 wherein said imagewise exposing is carried out at an energy that is below the energy that would ablate more than 30 weight % of said first and second layers.

15. The method of claim 11 wherein said imagewise exposing is carried out at from about 70 to about 300 mJ/cm².

16. The method of claim 11 wherein the glass transition temperature ($T_g$) of said first polymeric binder is higher than the glass transition temperature ($T_g$) of said second polymeric binder by at least 10° C.

17. The method of claim 11 wherein said first polymeric binder is derived at least in part from a (meth)acrylonitrile and an N-substituted cyclic imide, and optionally in addition from a (meth)acrylamide.

18. The method of claim 11 wherein during step B, said first layer is also removed in said exposed regions.

19. The method of claim 18 wherein during step B, said second layer and silicone rubber layer are removed using water or an aqueous solution comprising less than 8 weight % organic solvents and mechanical removal means, and said first layer is thereafter removed using an alkaline developer, in said exposed regions.

20. A method of making printed images by waterless printing, said method comprising, without ablation:
A) imagewise exposing the imageable element of claim 1 using infrared radiation to provide both exposed and non-exposed regions in said imageable element,
B) removing the crosslinked silicone rubber layer and second layer in predominantly only said exposed regions to provide an imaged element, and
C) contacting said imaged element on-press with only a lithographic printing ink.

21. A non-ablative imageable element comprising a substrate having thereon, in order:
a first layer comprising a first polymeric binder and an infrared radiation absorbing compound,
a second layer comprising colorant or contrast dye and a second polymeric binder and that comprises less than 3 weight % of infrared radiation absorbing compound, and
a crosslinked silicone rubber layer disposed over said second layer,
wherein said first polymeric binder is present in said first layer in an amount of at least 60 weight % and said first layer has a dry coverage of from about 0.7 to about 3 g/m², said second polymer binder is present in said second layer in an amount of at least 50 weight % and said second layer has a dry coverage of from about 0.3 to about 2 g/m² and said crosslinked silicone rubber layer has a dry thickness of from about 0.5 to about 3.5 µm.

* * * * *